United States Patent
Odagawa et al.

(10) Patent No.: US 7,791,119 B2
(45) Date of Patent: Sep. 7, 2010

(54) ELECTRO-RESISTANCE ELEMENT AND ELECTRO-RESISTANCE MEMORY USING THE SAME

(75) Inventors: Akihiro Odagawa, Osaka (JP); Yoshihisa Nagano, Osaka (JP)

(73) Assignee: Panasonic Corporation, Osaka (JP)

( * ) Notice: Subject to any disclaimer, the term of this patent is extended or adjusted under 35 U.S.C. 154(b) by 18 days.

(21) Appl. No.: 11/693,960

(22) Filed: Mar. 30, 2007

(65) Prior Publication Data

US 2007/0246832 A1    Oct. 25, 2007

(30) Foreign Application Priority Data

Apr. 19, 2006 (JP) .............................. 2006-115091

(51) Int. Cl.
*H01L 29/94* (2006.01)
(52) U.S. Cl. ..................... 257/295; 257/296; 257/298; 257/E27.09
(58) Field of Classification Search ................ 257/298, 257/E27.09, 295, 296
See application file for complete search history.

(56) References Cited

U.S. PATENT DOCUMENTS

| | | | | |
|---|---|---|---|---|
| 5,932,905 | A * | 8/1999 | O'Bryan et al. ............ | 257/298 |
| 6,204,139 | B1 | 3/2001 | Liu et al. | |
| 6,849,892 | B2 * | 2/2005 | Hideki ....................... | 257/298 |
| 6,965,137 | B2 * | 11/2005 | Kinney et al. ............... | 257/295 |
| 6,984,548 | B2 * | 1/2006 | Lung et al. .................. | 438/131 |
| 7,045,840 | B2 * | 5/2006 | Tamai et al. ................. | 257/295 |
| 7,050,319 | B2 * | 5/2006 | Moore et al. ................ | 365/63 |
| 7,498,600 | B2 * | 3/2009 | Cho et al. ........................ | 257/2 |
| 2003/0042522 | A1 * | 3/2003 | Mikawa et al. .............. | 257/298 |
| 2004/0188735 | A1 * | 9/2004 | Hideki ........................ | 257/295 |
| 2004/0245557 | A1 * | 12/2004 | Seo et al. .................... | 257/298 |
| 2004/0264234 | A1 * | 12/2004 | Moore et al. ................. | 365/148 |
| 2005/0029502 | A1 * | 2/2005 | Hudgens ....................... | 257/4 |
| 2005/0151277 | A1 * | 7/2005 | Kawazoe et al. ............ | 257/904 |
| 2005/0270821 | A1 * | 12/2005 | Nakano ...................... | 365/145 |
| 2006/0054950 | A1 * | 3/2006 | Baek et al. .................. | 257/295 |
| 2006/0081961 | A1 * | 4/2006 | Tanaka et al. ............... | 257/536 |
| 2006/0097288 | A1 * | 5/2006 | Baek et al. .................. | 257/208 |
| 2007/0257257 | A1 * | 11/2007 | Cho et al. ...................... | 257/43 |

FOREIGN PATENT DOCUMENTS

| | | |
|---|---|---|
| EP | 1 914 806 A1 | 4/2008 |
| JP | 2002-537627 | 11/2002 |
| JP | 2004-363604 | 12/2004 |
| JP | 2007-048779 A | 2/2007 |
| JP | 2007-180202 A | 7/2007 |
| WO | 00/49659 | 8/2000 |

\* cited by examiner

*Primary Examiner*—Steven Loke
*Assistant Examiner*—Brandon Fox
(74) *Attorney, Agent, or Firm*—Hamre, Schumann, Mueller & Larson, P.C.

(57) ABSTRACT

An electro-resistance element that has a different configuration from conventional elements and is excellent in both affinity with semiconductor manufacturing processes and heat treatment stability under a hydrogen-containing atmosphere is provided. An electro-resistance element includes an electro-resistance layer that has two or more states in which electric resistance values are different and being switchable from one of the two or more states into another by applying a predetermined voltage or current. The electro-resistance layer includes first and second elements being capable of forming a nitride, and nitrogen.

25 Claims, 27 Drawing Sheets

ELECTRO-RESISTANCE ELEMENT AND ELECTRO-RESISTANCE MEMORY USING THE SAME

BACKGROUND OF THE INVENTION

1. Field of the Invention

The present invention relates to an electro-resistance element, the resistance value of which changes by applying a voltage or current, and to an electro-resistance memory using the same.

2. Related Background Art

Memory elements are used in a wide variety of fields as essential electronic components that are important to support today's information-driven society. In recent years, as portable information terminals have become increasingly popular, demands for miniaturization of memory elements have been increasing, and non-volatile memory elements are not exceptions. As the scale of device miniaturization is approaching the nanometer range, however, a decrease in charge capacity C per information unit, i.e. bit, has become a problem with conventional charge storage type memory elements, typically DRAMs: Dynamic Random Access Memories. Although various improvements have been attempted to obviate this problem, there is a concern over the future technological limit.

As a memory element that is less prone to the adverse effects of miniaturization, a non-volatile memory element, i.e. an electro-resistance memory element, that records information by changes in electric resistance value R, not by changes in charge capacity C, has attracted attention. As this sort of electro-resistance memory element, an electro-resistance element that changes its electric resistance value R by applying a predetermined voltage or current is under development.

A typical electro-resistance element has a structure in which its electro-resistance layer is sandwiched by a pair of electrodes, and its electric resistance value R is changed by applying a predetermined voltage or current between the pair of electrodes. Such a change in the electric resistance value R is based on the state change of the electro-resistance layer by applying the predetermined voltage or current, and generally is known as a CER effect: a Colossal Electro-Resistance effect. A CER effect is different in principle from a so-called MR effect: a Magneto-Resistance effect, which is also a phenomenon in which an electric resistance value R of an element is changed.

An MR effect is a phenomenon in which an electric resistance value between a pair of magnetic materials sandwiching a non-magnetic material is changed when a direction of magnetization of one of the magnetic materials changes from parallel to antiparallel, or from antiparallel to parallel, to that of the other magnetic material. Currently, an MRAM: a Magneto-resistance Random Access Memory, using an element showing an MR effect, i.e. an MR element, is under development. However, as a component called a demagnetizing field in the magnetic material increases with miniaturization of the material, a magnetic field required to reverse a direction of magnetization becomes larger; thus, it is difficult to miniaturize further than a certain extent by using an MR element. As a CER effect does not have such a "size restriction" and it gains generally larger electric resistance change compared to an MR effect, an electro-resistance element is expected highly as the next generation non-volatile memory implementing even further miniaturization, such as a ReRAM: an electro-Resistance Random Access Memory.

As this sort of electro-resistance element, U.S. Pat. No. 6,204,139 and JP 2002-537627A disclose elements including perovskite oxides in electro-resistance layers. The former publication mentions the oxide with $Pr_{0.7}Ca_{0.3}MnO_3$ (PCMO), and the latter uses Cr-doped $BaSrTiO_3$ (BSTCO). JP 2004-363604A discloses an element including a metallic oxide, such as NiO, in an electro-resistance layer. Every element disclosed in the three publications above has an electro-resistance layer using an iron oxide.

In order to construct a memory cell array using electro-resistance elements, the element needs to be combined with a semiconductor element for selecting the element on recording and reading information, such as a transistor or a diode. However, crystallization of perovskite oxides, such as PCMO and BSTCO, generally requires a high temperature of approximately 650° C. to 850° C., which leads to an issue of affinity with semiconductor manufacturing processes. In particular, in order to achieve element miniaturization, it is desired that the manufacturing process temperature for the electro-resistance element be set lower than the range above, for example 400° C. or lower.

When an electro-resistance element is combined with a semiconductor element, a high-temperature heat treatment, typically at about 400° C. to 500° C., under a hydrogen-containing atmosphere is necessary for the purpose of improving switching characteristics of the semiconductor element, such as reducing wiring resistance. The heat treatment, however, is prone to deteriorate resistance change characteristics of an element using a perovskite oxide, such as PCMO.

On the other hand, the element disclosed in JP 2004-363604A has its electro-resistance layer made of a metallic oxide, such as NiO, and it is considered that the element can be formed at a lower temperature compared to perovskite oxides. It further is expected to lower the temperature during the manufacturing processes of the element. The resistance change characteristics of the element disclosed in JP 2004-363604A are, however, prone to be deteriorated by a heat treatment under a hydrogen-containing atmosphere similar to that of the elements disclosed in U.S. Pat. No. 6,204,139 and JP 2002-537627A. This is supposedly because the electro-resistance layer of each element disclosed in the three publications is made of an oxide and the oxide, and deoxidization by exposure to hydrogen during the heat treatment causes a structural defect, such as extreme oxygen deficiency, of the electro-resistance layer.

It is an object of the present invention to provide an electro-resistance element that has a different configuration from those of the conventional elements with their electro-resistance layers made of an oxide and is excellent in its affinity with semiconductor manufacturing processes as well as its heat treatment stability under a hydrogen-containing atmosphere.

Another object of the present invention is to provide an electro-resistance memory using the same.

SUMMARY OF THE INVENTION

An electro-resistance element according to the present invention includes an electro-resistance layer having two or more states in which electric resistance values are different and being switchable from one of the two or more states into another by applying a predetermined voltage or current. The electro-resistance layer includes first and second elements capable of forming a nitride, and nitrogen.

An electro-resistance memory according to the present invention includes the electro-resistance element according to the present invention as a memory element.

The electro-resistance element of the present invention is, unlike the conventional electro-resistance elements having their electro-resistance layers made of perovskite oxides, excellent in its affinity with semiconductor manufacturing processes. For example, it can be formed by manufacturing processes at a temperature of 400° C. or lower.

The electro-resistance element of the present invention is, unlike the conventional electro-resistance elements having their electro-resistance layers made of oxides, excellent in its heat treatment stability under a hydrogen-containing atmosphere as well. One possible explanation for the electro-resistance elements of the present invention showing an excellent heat treatment stability under a hydrogen-containing atmosphere is considered that even the hydrogen exposure does not easily cause a structural defect in the electro-resistance layer.

DETAILED DESCRIPTION OF THE INVENTION

Figure 1:
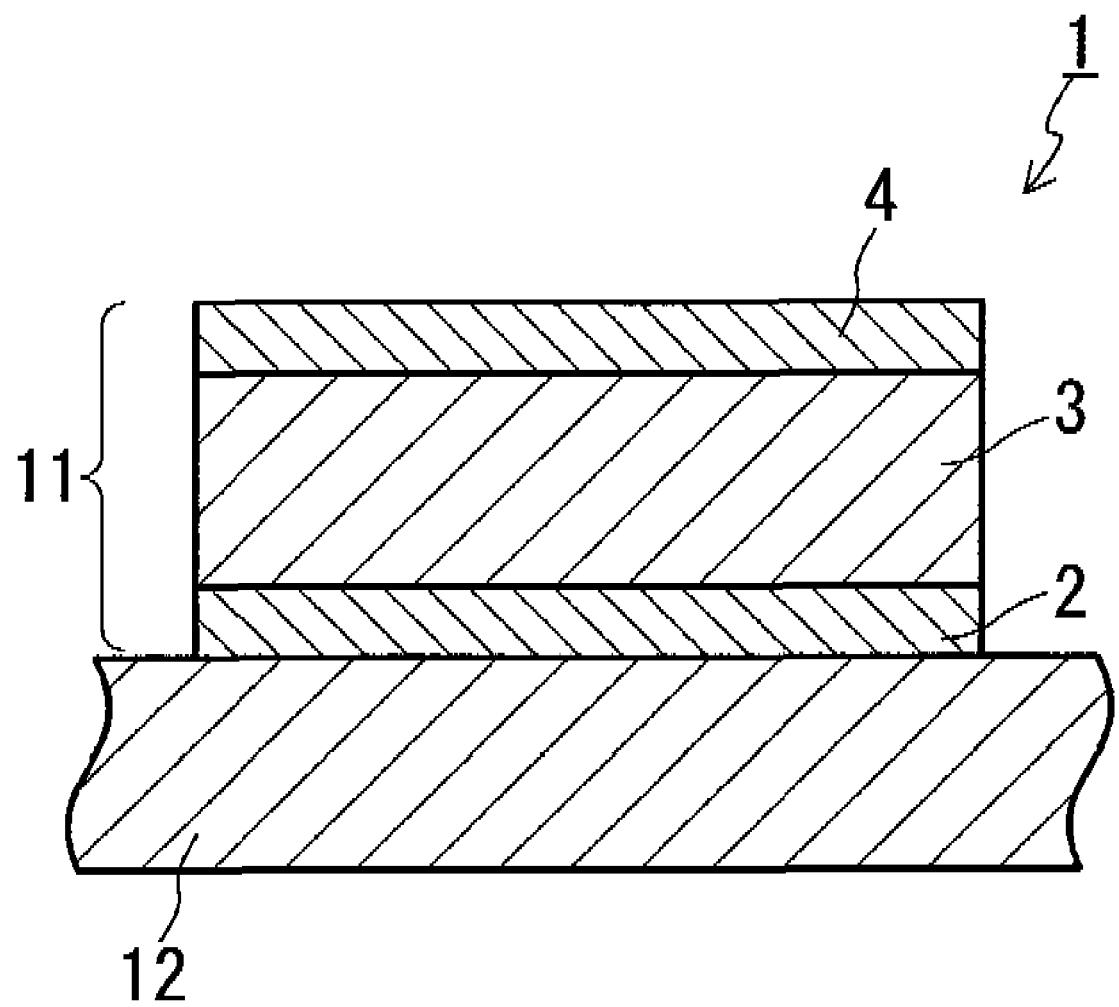
FIG. 1 is a cross-sectional view schematically illustrating an example of the electro-resistance element according to the present invention.

Hereinbelow, preferred embodiments of the present invention are described with reference to the drawings. In the following description, the same components are denoted by the same reference numerals, and further elaboration thereof may be omitted.

An electro-resistance element 1 shown in FIG. 1 includes a substrate 12, a pair of electrodes, which are a lower electrode 2 and an upper electrode 4, and an electro-resistance layer 3 sandwiched by the lower electrode 2 and the upper electrode 4. The lower electrode 2, the electro-resistance layer 3 and the upper electrode 4 are disposed as a multilayer structure (stacked structure) 11 on the substrate 12 in this order.

The layer 3 includes first and second elements being capable of forming a nitride, and nitrogen.

In the element 1, there are two or more states in which electric resistance values of the layer 3, i.e. those between the lower electrode 2 and the upper electrode 4, are different. The element 1 may be switched from one of the two or more states into another by applying a predetermined voltage or current to the layer 3, more concretely between the lower electrode 2 and the upper electrode 4. When the electrode 1 has two states in which electric resistance values are different, where a state A is defined as a state of relatively high resistance and a state B as that of relatively low resistance, the element 1 is switched from the state A into the state B, or from the state B into the state A, by applying a predetermined voltage or current.

The element 1 described above can be formed by manufacturing processes at a lower temperature compared to conventional electro-resistance elements having their electro-resistance layer made of perovskite oxides, for example at a temperature of 400° C. or lower, which makes it excellent in its affinity with semiconductor manufacturing processes. The element 1 is, different from the conventional electro-resistance elements having their electro-resistance layers made of oxides, excellent in its heat treatment stability under a hydrogen-containing atmosphere as well. That is, the element 1 having the configuration described above facilitates application to various devices combined with semiconductive elements, such as electro-resistance memories, and it brings an advantage in achieving miniaturization of elements and in improving integration and characteristics of devices associated with the miniaturization of elements.

The element 1 also shows excellent resistance change characteristics, and it is possible to gain a high resistance change ratio, for instance. The resistance change ratio is a numerical value that serves as an index of the resistance change characteristics of an element, and is a value obtained by the formula $(R_{MAX} - R_{MIN})/R_{MIN}$, wherein $R_{MAX}$ denotes the maximum electric resistance value and $R_{MIN}$ denotes the minimum electric resistance value that the element shows.

Each of the first and the second elements may be an element capable of forming a nitride, and may be a metallic element or Si, for example.

More specifically, the first element may be at least one selected from Ti (titanium), Ta (tantalum), Co (cobalt), Cu (copper) and Nb (niobium), for example. Among all, Ti is preferred because a higher resistance change ratio can be obtained by properly selecting the second element included in the layer 3 along with the first element.

The second element may be at least one selected from Al (aluminum), Hf (hafnium), Cr (chromium) and Si (silicon), for example. Among all, Al is preferred because a higher resistance change ratio can be obtained by properly selecting the first element included in the layer 3 along with the second element.

Combination of the first and the second elements is not particularly limited, but it is preferred to have Ti for the first element and Al for the second element as a higher resistance change ratio can be obtained. The layer 3 as such also may be described as including Ti, Al and nitrogen.

When the layer 3 includes Ti as its first element and Al as its second element, a ratio Z of Al content $X_2$ (wt. %) in the layer 3 to a sum of Ti content $X_1$ (wt. %) in the layer 3 and the Al content $X_2$ (wt. %) ($Z=X_2/(X_1+X_2)$) is preferably 0.5 to 0.9.

Configuration of the layer 3 is not particularly limited as long as it includes the first and the second elements and nitrogen. The layer 3 may include, for example, a nitride of the first element (nitride A) and a nitride of the second element (nitride B). In such a case, the layer 3 also may be described as including nitrides of two or more kinds of element.

An example of structure of the layer 3 including the nitrides A and B may be a solid solution of the nitrides A and B. Other than that, a structure having a domain of the nitride A dispersed in a matrix of the nitride B in granular, i.e. granular structure, also may be considered as another example.

The layer 3 may be a layer obtained by stacking a nitride A film with a thickness of 1 nm or thinner and a nitride B film with a thickness of 1 nm or thinner alternately, and further specific examples are shown in Examples below.

Considering the examples shown above as the first and second elements in the states of nitride from a perspective of electrical conductivity, the nitride of the first element tends to show a higher electrical conductivity than that of the second element. That is, the layer 3 including the first and the second elements given examples above also may be described as to include the nitride A relatively low in resistivity and the nitride B relatively high in resistivity.

From this perspective, it is preferable that a volume resistivity of the first element in a state of nitride is $10^{-1}\Omega \cdot cm$ or lower, and a volume resistivity of the second element in a state of nitride is $10^3 \Omega \cdot cm$ or greater. Here, the nitrides may be considered as compositions fulfilling a stoichiometric mixture ratio in respective elements, and a composition greatest in volume resistivity may be considered as the first element and a composition lowest in that may be as the second element when a plurality of compositions fulfills a stoichiometric mixture ratio.

The layer 3 further may include oxygen. In this case, it is possible to reduce leakage current in the layer 3 depending on the amount of oxygen included in the layer 3, and it is possible to form an element 1 more excellent in its resistivity change characteristics. When the electro-resistance layer includes excessive oxygen, however, the heat treatment stability of the element under a hydrogen atmosphere is deteriorated. The oxygen content in the layer 3 may be, thus, approximately 10 wt. % or lower in general.

An example of the layer 3 further including oxygen may include the layer 3 including an oxynitride of at least one element selected from the first and the second elements. The layer 3 may include an oxynitride containing both of the first and the second elements.

When the layer 3 includes the oxynitride, the oxynitride may be included in at least a part of the layer 3. For example, it may be the layer 3 made of the oxynitride, or the layer 3 having at least as a part of the domain in the granular structure made of an oxynitride. It may be the layer 3 formed by stacking a film made of a nitride including the first and the second elements and a film made of the oxynitride.

When the layer 3 further includes oxygen, the layer 3 may partially include at least one oxide selected from the first and the second elements.

The lower electrode 2 basically may have electrical conductivity, and may be made of, for example, Au (gold), Pt (platinum), Ru (ruthenium), Ir (iridium), Ti (titanium), Al (aluminum), Cu (copper), Ta (tantalum), iridium-tantalum alloy (Ir—Ta) or indium-tin oxide (ITO), or any alloy, oxide, nitride, fluoride, carbide, boride or silicide of these. From a perspective of further improving affinity with semiconductor manufacturing processes, the lower electrode 2 preferably is made of, for example, Ir, Ru, Ir—O (iridium oxide), Ru—O (ruthenium oxide), Ti, Al, Ti—Al alloy and Ti—Al—N (titanium aluminum nitride). The lower electrode 2 may be made of a stacked structure having two or more different materials selected from the materials mentioned above.

The upper electrode 4 basically may have electrical conductivity, and may be made of, for example, Au, Pt, Ru, Ir, Ti, Al, Cu, Ta, Ir—Ta or ITO, or any alloy, oxide, nitride, fluoride, carbide or boride of these. From a perspective of further improving affinity with semiconductor manufacturing processes, the upper electrode 4 is preferably made of materials resistant to oxidizing or capable of maintaining electrical conductivity after oxidization, such as Ir, Ru, Re, Os, Rh, Pt and Au. From the same perspective, the upper electrode 4 is preferably made of oxides, such as Ir—O, Ru—O, Re—O (rhenium oxide), Os—O (osmium oxide), Rh—O (rhodium oxide), or of nitrides, such as Ti—N (titanium nitride), Fe—N (iron nitride), Ti—Al—N. The upper electrode 4 may be made of a stacked structure having two or more of different materials selected from the materials mentioned above.

The substrate 12 may be, for example, a silicon (Si) substrate and a surface of the substrate 12 that makes contact with the lower electrode 2 may be oxidized, i.e. an oxide film may be formed on the surface of the substrate 12, in this case. When the substrate 12 is a Si substrate, combining the element of the present invention with semiconductive elements is facilitated. In the present specification, processed substrates with transistors or contact plugs (hereinafter, also may be referred to simply as "plugs") formed thereon are also mentioned as "substrates".

The configuration of the electro-resistance element of the present invention is not particularly limited as long as it includes the electro-resistance layer 3 having two or more states in which electric resistance values are different and being switchable from one of the two or more states into another by applying a predetermined voltage or current.

Figure 2:
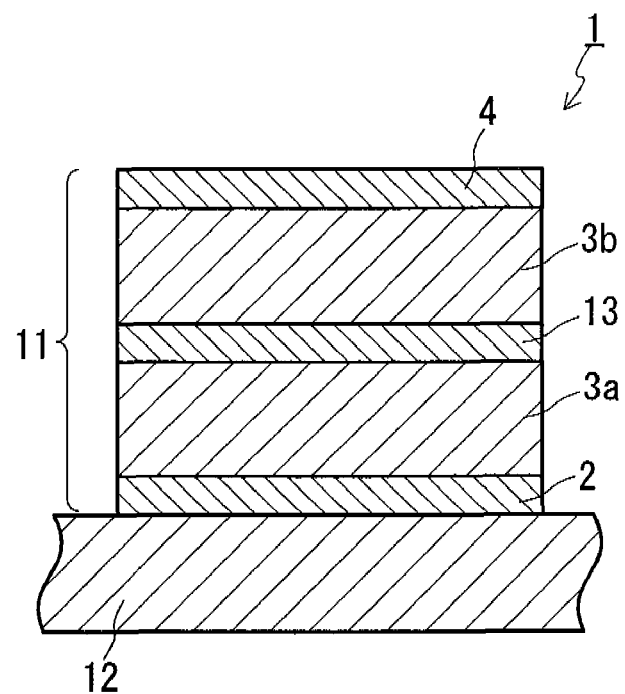
FIG. 2 is a cross-sectional view schematically illustrating another example of the electro-resistance element according to the present invention.

For example, it may have a configuration in which the stacked structure 11 including the lower electrode 2, the electro-resistance layer 3 and the upper electrode 4 is formed on the substrate 12 and the layer 3 is sandwiched by the lower electrode 2 and the upper electrode 4 as shown in FIG. 1. It also may have a configuration, for example, in which a pair of electric-resistance layers 3a and 3b sandwiching an intermediate electrode 13 is disposed between the lower electrode 2 and the upper electrode 4 as shown in FIG. 2. In this case, by applying a predetermined voltage or current to at least one of the electrode pairs selected from between the lower electrode 2 and the intermediate electrode 13, between the upper electrode 4 and the intermediate electrode 13, and between the lower electrode 2 and the upper electrode 4, the element 1 is switchable among at least three states, each having a different electric resistance value. In other words, the element 1 achieving multi-level states is realized. Moreover, even further multi-level states can be achieved by stacking the similar multilayer structure.

The predetermined voltage or current may be applied to the element 1 via the lower electrode 2 and the upper electrode 4. By applying the predetermined voltage or current, the state of the element 1 changes, for example, from the state A into the state B. The state after the change, the state B for example, is retained until a predetermined voltage or current is applied to the element 1 again, and that state is changed again by applying the voltage or current from the state B into the state A, for example.

The predetermined voltages or currents to be applied to the element 1 in the states A and B are not necessarily the same, and their properties, such as magnitude, polarity and flowing direction, may vary depending on the state of the element 1. That is, "a predetermined voltage or current" in the present specification may be such a "voltage or current" that the element 1 in a certain state can be changed into another state that is different from the former state. In addition, "a predetermined voltage or current" in the present specification also may be defined as a driving voltage or current.

Thus, the element 1 is able to hold its electric resistance value until a predetermined voltage or current is applied to the element 1. A non-volatile electro-resistance memory, which is a memory element or a memory array in which two or more memory elements are aligned, can be constructed by combining the element 1 with a mechanism for detecting the states of the element 1, i.e. a mechanism for detecting the electric resistance value of the element 1, and assigning a bit to each of the states, for example, the state A is assigned to "0" and the state B to "1". In addition, it is possible to repeat such a state switching at least twice in the element 1, so that a non-volatile random access memory can be constructed. Further, it is also possible to apply the element 1 to a switching element by assigning ON or OFF to each of the above states.

It is preferable that the voltage or current to be applied to the element 1 is in a pulse form (a pulsed voltage or a pulsed current). Thus, on constructing a device, such as a memory, using the element 1, it becomes possible to reduce power consumption and improve switching efficiency in the device. The pulse shape is not particularly limited and may be at least one selected from, for example, a sine waveform, a rectangular waveform and a triangular waveform. The pulse width may be generally in the range of several nanoseconds to several milliseconds.

In order to better facilitate driving the devices, the pulse shape is preferably in a triangular waveform. In order to make the response of the element 1 faster, the pulse shape is preferably in a rectangular waveform, which enables a response in the range of several nanoseconds to several microseconds. In order to achieve the facilitated driving, reduced power consumption and faster response speed all together, the pulse shape is preferably in a sine waveform or in a trapezoidal waveform, formed by replacing rising and falling edges of the rectangular waveform with adequately sloped shapes. The pulses of the sine and trapezoidal waveforms are suitable for the response speed of the element 1 set in the range of several ten nanoseconds to several hundred microseconds, while the triangular waveform pulse is suitable for the response speed of the element 1 set in the range of several ten microseconds to several milliseconds.

It is preferred to apply a voltage to the element 1, which better facilitates miniaturization of the element 1 and size reduction of the devices using the element 1. When the element 1 has the two states of the states A and B, a potential difference-applying device for creating a potential difference between the lower electrode 2 and the upper electrode 4 may be connected to the element 1. Here, for example, the state of the element 1 may be changed from the state A into the state B by applying a bias voltage such that the potential of the upper electrode 4 becomes positive compared to that of the lower electrode 2, i.e. positive bias voltage, to the element 1, while the state of the element 1 may be changed from the state B into the state A by applying a bias voltage such that the potential of the upper electrode 4 becomes negative compared to that of the lower electrode 2, i.e. negative bias voltage, to the element 1. In other words, by applying a voltage with its polarity reversed from that on changing from the state A into the state B, the state of the element 1 may be changed from the state B into the state A. A pulse generator may be used, for example, as such a potential difference-applying device.

It becomes possible to construct an electro-resistance memory by combining the electro-resistance element of the present invention with a semiconductor element, for example a diode or a transistor, such as a MOS field-effect transistor (MOS-FET).

Figure 3:
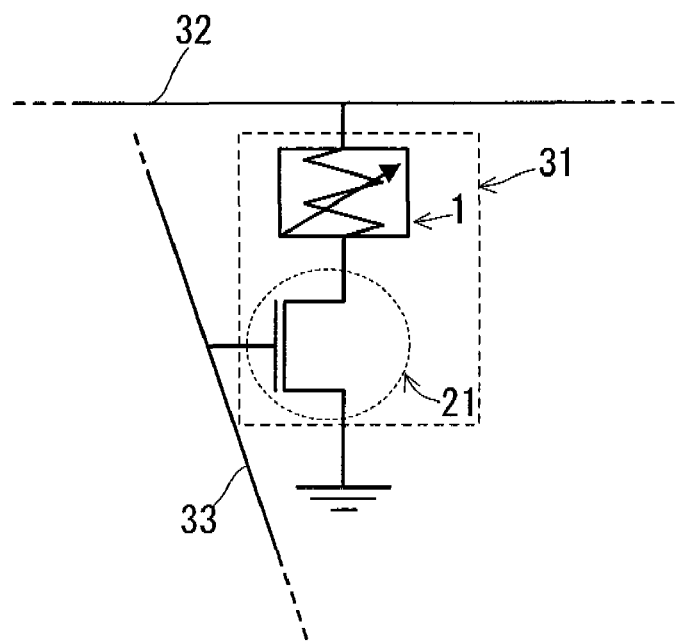
FIG. 3 is a schematic view illustrating an example of the electro-resistance memory (element) provided with the electro-resistance element according to the present invention.

FIG. 3 shows an example of an electro-resistance memory (element) combining the electro-resistance element of the present invention with a MOS-FET.

An electro-resistance memory element 31 shown in FIG. 3 has the electro-resistance element 1 and a transistor 21, and the element 1 is connected electrically to the transistor 21 and a bit line 32. A gate electrode of the transistor 21 is connected electrically to a word line 33, and the other electrode of the transistor 21 is grounded. Such a memory element 31 enables detection of the states in the element 1, i.e. detection of the electric resistance value of the element 1, and application of a predetermined voltage or current to the element 1, using the transistor 21 as a switching element. For example, when the element 1 shows two states in which electric resistance values are different, the memory element 31 shown in FIG. 3 may be used as a 1-bit electro-resistance memory element.

The transistor 21 may be a common configuration, such as a MOS-FET.

Figure 4:
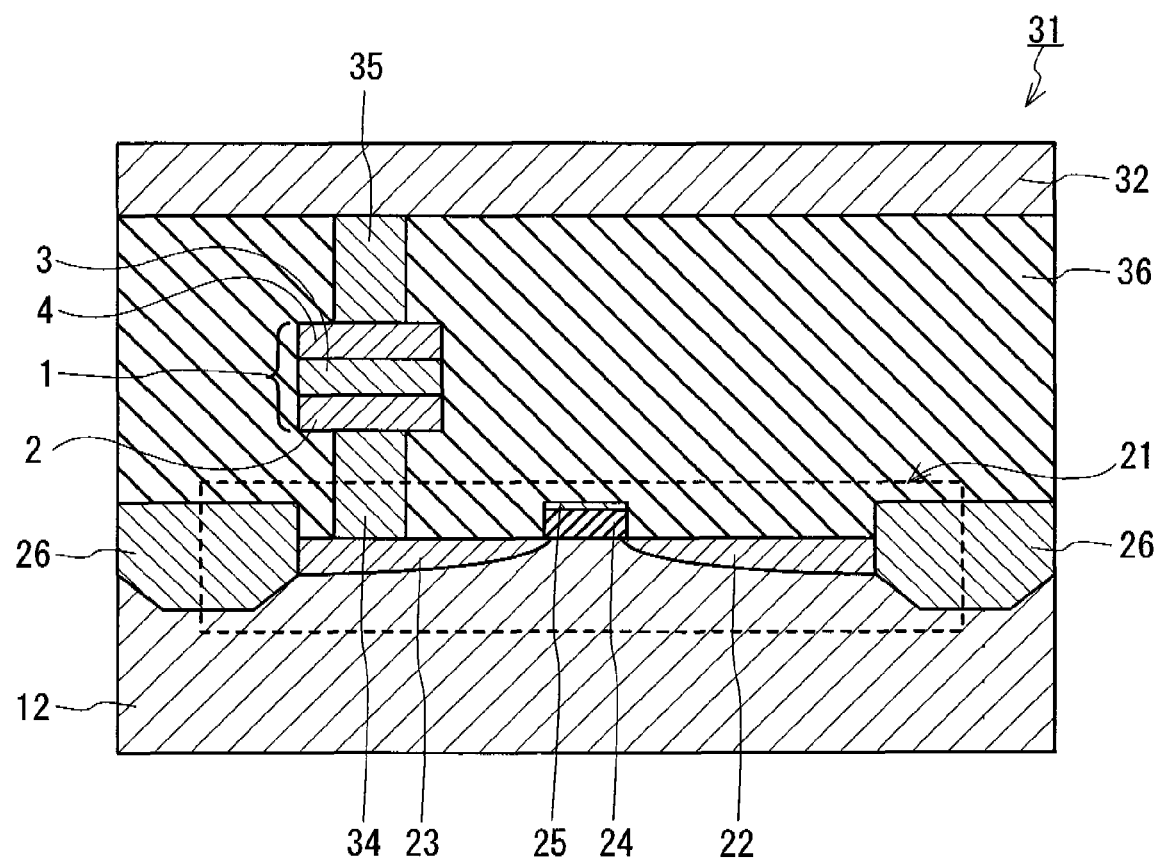
FIG. 4 is a cross-sectional view schematically illustrating an example of the electro-resistance memory (element) provided with the electro-resistance element of the present invention.

FIG. 4 shows an example of a specific configuration of the memory element 31 including the electro-resistance element 1 and the transistor 21. In the memory element 31 shown in FIG. 4, the element 1 is formed on the substrate 12 on which the transistor 21 is formed, and the transistor 21 and the element 1 are integrated. More specifically, a source 22 and a drain 23 are formed on the substrate 12, and the drain 23 and the lower electrode 2 of the element 1 are connected electrically via a plug 34. The source 22 may be connected electrically, such as by grounding, though the electrical connection is not shown in the figure. A gate insulating film 24 and a gate electrode 25 are formed between the source 22 and the drain 23 on the substrate 12, and the electro-resistance layer 3 and the upper electrode 4 are stacked on the lower electrode 2 of the element 1 in this order. The gate electrode 25 is connected electrically to a word line (not shown), and the upper electrode 4 is connected electrically to the bit line 32 via a plug 35 as well. An interlayer insulating layer 36 is disposed on the substrate 12 overlaying all over the surface of the substrate 12, the transistor 21 and the element 1. The parts indicated with a reference numeral 26 on the substrate 12 are defined as element isolating sections 26.

The interlayer insulating layer 36 may be made of an insulating material, such as $SiO_2$ or $Al_2O_3$, or may have a stacked structure of two or more kinds of materials. For the insulating material, organic materials, such as a resist material, may be used other than $SiO_2$ and $Al_2O_3$. In a case of using an organic material, the layer 36 can be formed easily by a technique such as spinner coating; this facilitates forming the layer 36 having a planar surface even when it has to be formed on a non-planar surface. Materials such as polyimide, which is a photosensitive resin, preferably are used for the layer 36 in such a case.

Although in the example shown in FIG. 4, the electro-resistance memory element is constructed by combining an electro-resistance element with a MOS-FET, the configuration of the electro-resistance memory of the present invention is not limited to the example shown in FIG. 4. It also may be constructed, for example, by combining the electro-resistance element of the present invention with an arbitrary semiconductor element, such as other types of transistors or diodes, as a selective element.

Although the memory element 31 shown in FIG. 4 has a structure in which the element 1 is disposed directly on the transistor 21, the transistor 21 may be disposed at distant locations from the element 1 and the lower electrode 2 and the drain 23 may be connected electrically by an extraction electrode. While the element 1 and the transistor 21 preferably are disposed apart from each other to simplify the manufacturing processes of the memory element 31, the area occupied by the memory element 31 can be made smaller and therefore it is possible to realize an electro-resistance memory array with a higher density by disposing the element 1 directly on the transistor 21 as shown in FIG. 4.

Information may be recorded into the memory element 31 by applying a predetermined voltage or current to the element 1, and the information recorded in the element 1 may be, for example, read by altering the magnitude of the voltage or current applied to the element 1 from that when recorded.

An example of how to apply a pulsed voltage to the element 1 as a method of recording and reading information is illustrated with reference to FIG. 5.

Figure 5:
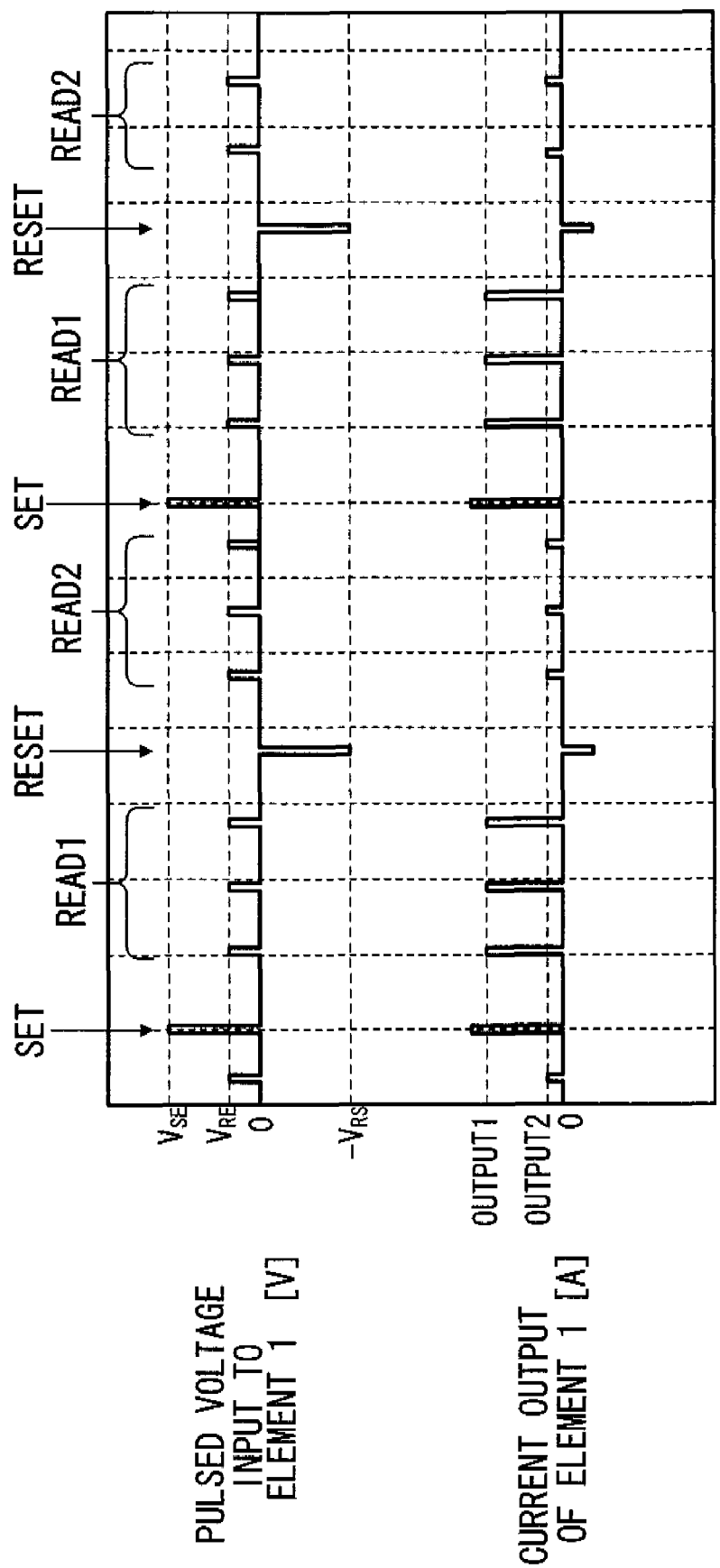
FIG. 5 is a chart for illustrating an example of the information recording and reading method in the electro-resistance memory provided with the electro-resistance element of the present invention.

In the example shown in FIG. 5, the electro-resistance element 1 has such resistance change characteristics that its state is switched from a state A, where the electric resistance is relatively large, into a state B, where the electric resistance is relatively small, by applying a positive bias voltage having a magnitude of a certain threshold value ($V_0$) or greater and that it is switched from the state B into the state A by applying a negative bias voltage having a magnitude of a certain threshold value ($V_0'$) or greater The positive bias voltage is defined as a voltage such that the potential of the upper electrode 4 compared to that of the lower electrode 2 becomes positive, and the negative bias voltage is a voltage such that the potential of the upper electrode 4 compared to that of the lower electrode 2 becomes negative. The magnitude of each bias voltage corresponds to the magnitude of the potential difference between the lower electrode 2 and the upper electrode 4.

When the initial state of the element 1 is the state A, the element 1 is switched from the state A into the state B (SET in FIG. 5) upon applying a positive bias voltage $V_{SE}(|V_{SE}| \geq V_0)$ in a pulse form between the lower electrode 2 and the upper electrode 4. The positive bias voltage applied here is denoted as SET voltage.

Here, the electric resistance value of the element 1 can be detected as a current output of the element 1 by applying a positive bias voltage that is smaller than the SET voltage and whose magnitude is less than $V_0$ to the element 1 (READ1 and OUTPUT1 shown in FIG. 5). The electric resistance value of the element 1 also can be detected by applying a negative bias voltage whose magnitude is less than $V_0'$ to the element 1. These voltages applied for detecting the electric resistance value of the element 1 are denoted as READ voltage ($V_{RE}$). The READ voltage may be in a pulse form as shown in FIG. 5, in which it is possible to reduce the power consumption and to improve the switching efficiency in the memory element 31 similar to the case of the SET voltage in a pulse form. Since applying the READ voltage does not change the state of the element 1 (state B), the identical electric resistance value can be detected even when the READ voltage is applied a plurality of times.

Then, the element 1 is switched from the state B into the state A (RESET shown in FIG. 5) by applying a negative bias voltage $V_{RS}(|V_{RS}| \geq V_0')$ in a pulse form between the lower electrode 2 and the upper electrode 4. The negative bias voltage applied here is denoted as RESET voltage.

Again, the electric resistance value of the element 1 can be detected as the current output of the element 1 by applying the READ voltage to the element 1 (READ2 and OUTPUT2 shown in FIG. 5). In this case as well, since applying the READ voltage does not change the state of the element 1 (state A), the identical electric resistance value can be detected even when the READ voltage is applied a plurality of times.

Thus, it is possible to record and read information to and from the memory element 31 by applying a voltage in a pulse form, and the magnitude of the output current from the element 1 obtained by reading varies corresponding to the state of the element 1. When the state of the output current being relatively large (OUTPUT1 in FIG. 5) is defined as "1" and that of relatively small (OUTPUT2 in FIG. 5) is defined as "0", it becomes possible to make the memory element 31 as an memory element that records the information "1" by the SET voltage and records the information "0", or erases the information "1", by the RESET voltage.

To apply a voltage in a pulse form to the element 1 in the memory element 31 shown in FIG. 4, the transistor 21 may be turned ON by the word line; a voltage may be applied via the bit line 32.

The magnitude of READ voltage may be generally in the range of ¼ to 1/1000 of that of SET and RESET voltages. Specific values of the SET and RESET voltages are normally within the range of 0.1 V to 20 V, preferably within the range of from 1 V to 12 V, while they are dependent on the configuration of the element 1.

Figure 6:
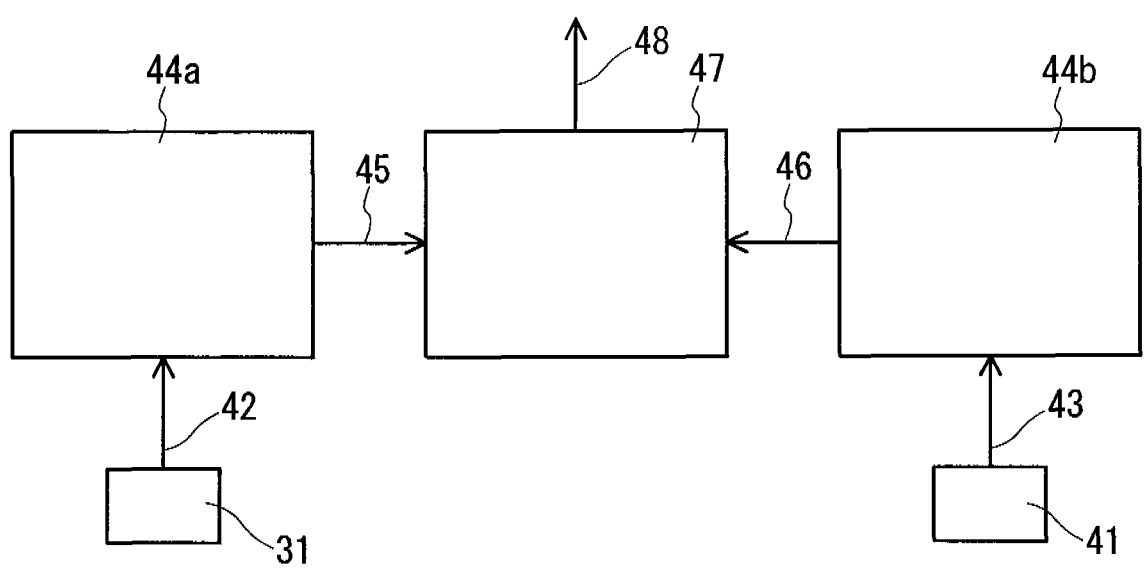
FIG. 6 is a chart for illustrating an example of the information reading method in the electro-resistance memory provided with the electro-resistance element of the present invention.

The electric resistance value of the element 1 preferably is detected by preparing a reference element separately from the element to be detected and detecting a difference between the resistance value of the element to be detected, such as an output current value, and a reference resistance value, such as a reference output current value, obtained by applying the READ voltage to the reference element in the same manner. FIG. 6 illustrates a method of detecting an output signal 48 obtained by a differential amplification circuit 47; an output 45 obtained by amplifying an output 42 from the memory element 31 by a negative feedback amplification circuit 44a and an output 46 obtained by amplifying an output 43 from a reference element 41 by a negative feedback amplification circuit 44b are input to the circuit 47.

Figure 7:
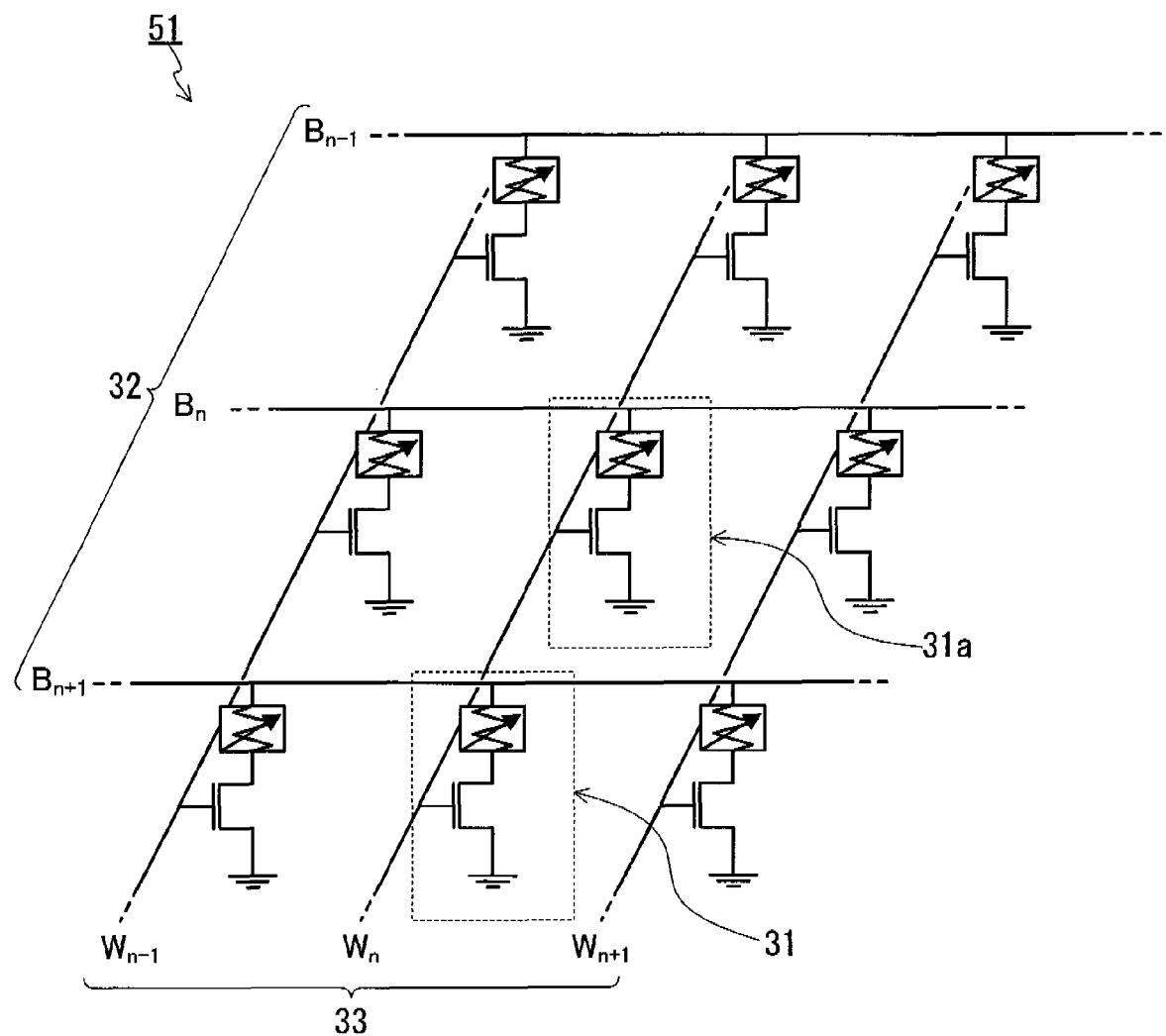
FIG. 7 is a schematic view illustrating an example of the electro-resistance memory (array) provided with the electro-resistance element of the present invention.

A non-volatile random access electro-resistance memory (array) 51 can be constructed when two or more memory elements 31 are aligned in a matrix, as shown in FIG. 7. The memory array 51 achieves recording and reading information to and from a memory element 31a, which is located at a coordinate ($B_n$, $W_n$) by selecting a bit line ($B_n$) from two or more bit lines 32 and a word line ($W_n$) from two or more word lines 33.

As shown in FIG. 7, at least one memory element 31 may be a reference element when two or more memory elements 31 are aligned in a matrix.

Figure 8:
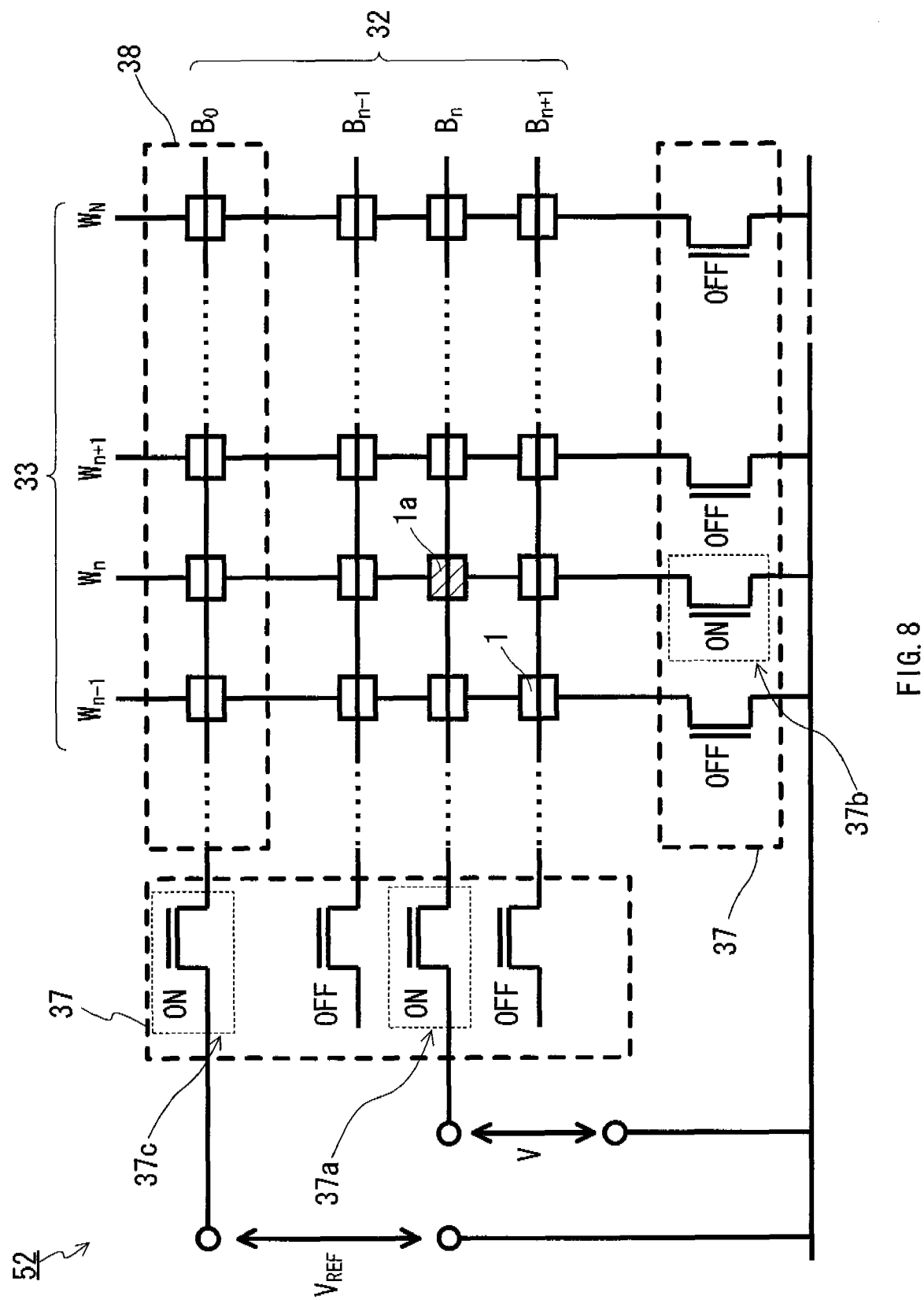
FIG. 8 is a schematic view illustrating another example of the electro-resistance memory (array) provided with the electro-resistance element of the present invention.

As shown in FIG. 8, a non-volatile random access electro-resistance memory (array) 52 also may be constructed by using pass transistors 37 and aligning two or more electro-resistance elements 1 in a matrix. In the memory array 52, the bit lines 32 are connected electrically to the lower electrodes 2 of the elements 1, and the word lines 33 to the upper electrodes 4 of the elements 1, respectively. The memory array 52 achieves recording and reading information to and from an electro-resistance element 1a, which is located at a coordinate ($B_n$, $W_n$) by selectively turning ON a pass transistor 37a that is connected to a bit line ($B_n$) selected from the two or more bit lines 32 and a pass transistor 37b that is connected to a word line ($W_n$) selected from the two or more word lines 33. Reading information from the element 1a may be enabled by, for example, measuring the voltage V shown in FIG. 8, which is the voltage corresponding to the electric resistance value of the element 1a. A reference element group 38 is disposed in the memory array 52 shown in FIG. 8, and the difference between the outputs from the element 1a and from the group 38 can be detected by selectively turning ON a pass transistor 37c corresponding to a bit line ($B_0$) connected to the group 38 and measuring the voltage $V_{REF}$ shown in FIG. 8.

In addition, the memory array 52 shown in FIG. 8 allows using the elements 1 that were not selected by the pass transistor 37 as the reference elements. Such a method facilitates the configuration of the memory array, although the operation as a memory array may become somewhat slower because the reference elements have to be assigned appropriately while the states of the elements on the vicinity of the elements 1a selected by the pass transistor 37 are verified.

Figure 9:
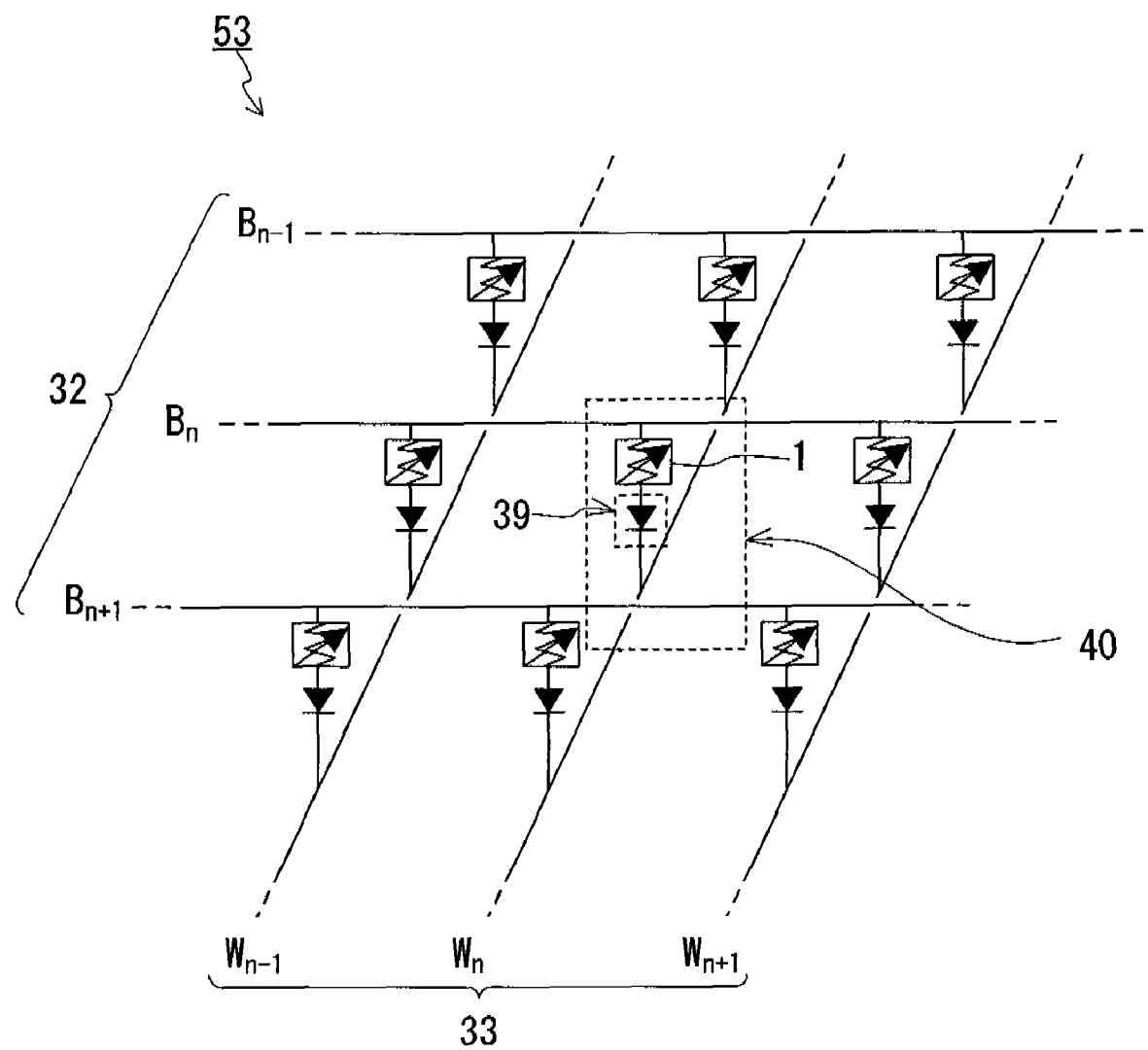
FIG. 9 is a schematic view illustrating still another example of the electro-resistance memory (array) provided with the electro-resistance element of the present invention.

A non-volatile random access electro-resistance memory (array) 53 can be constructed by aligning two or more of memory elements 40 in a matrix, which is made by combining the elements 1 of the present invention with selective elements 39 (diodes in FIG. 9 as an example) having nonlinear current-voltage characteristics (I-V characteristics), as shown in FIG. 9.

The memory elements 40 in FIG. 9 achieve reduction of wraparound resistance via the selective elements 39 by electrically connecting the elements 1 and the selective elements 39 in series between the bit lines 32 and the word lines 33.

The memory arrays shown in FIGS. 7 to 9 also may be described as having a structure in which two or more of the electro-resistance elements 1 are connected to the switching elements for selecting the element when recording and reading information.

The electro-resistance element 1 of the present invention and each layer configuring the element 1 may be formed by applying manufacturing processes of semiconductors, such as common thin-film forming and micro-fabricating processes. For example, various sputtering techniques, such as pulse laser deposition (PLD), ion beam deposition (IBD), cluster ion beam, RF, DC, electron cyclotron resonance (ECR), helicon, inductively coupled plasma (ICP), and facing target sputtering, evaporation methods, such as molecular beam epitaxy (MBE), and ion plating may be employed. Other than these PVD (Physical Vapor Deposition) techniques, it is also possible to employ CVD (Chemical Vapor Deposition), MOCVD (Metal Organic Chemical Vapor Deposition), a plating method, MOD (Metal Organic Decomposition), or a sol-gel method.

For the micro-fabrication of each layer, the following techniques, which are commonly used in the manufacture processes for semiconductors and magnetic devices (for example, magnetoresistive elements such as GMR and TMR), may be used in combination: physical or chemical etching such as ion milling, RIE (Reactive Ion Etching), and FIB (Focused Ion Beam), and photolithography techniques using a stepper for forming micro patterns and an EB (Electron Beam) technique. The planarization of each layer may be performed by, for example, CMP (Chemical Mechanical Polishing), cluster-ion beam etching, or the like.

When forming each layer configuring the element 1 requires a process of oxidizing, nitriding or oxynitriding, the process may use atoms, molecules, ions, radicals, plasma and the like of oxygen or nitrogen. As an example of such a case, when forming an oxynitride layer of Ti and Al (Ti—Al—N—O) by sputtering, a nitride layer of Ti and Al (Ti—Al—N) may be formed, for example, under an argon atmosphere or an argon-nitrogen mixture atmosphere and the formed nitride layer may be oxidized by making contact with oxygen. To create plasma and radicals, various methods can be employed, such as electron cyclotron resonance (ECR) discharge, glow discharge, RF discharge, helicon and inductively coupled plasma (ICP).

The same techniques may be applied for deposition, micro-fabricating and planarization of protective insulation films, barrier metals and plug metals described below. Electronic devices, such as memory elements and memory arrays including an electro-resistance element of the present invention, may be formed in the same manner.

An example of a method of manufacturing the electro-resistance element of the present invention is shown in FIGS. 10A to 10H, as an example of that of manufacturing a memory element in which the electro-resistance element of the present invention is incorporated.

Figure 10A:
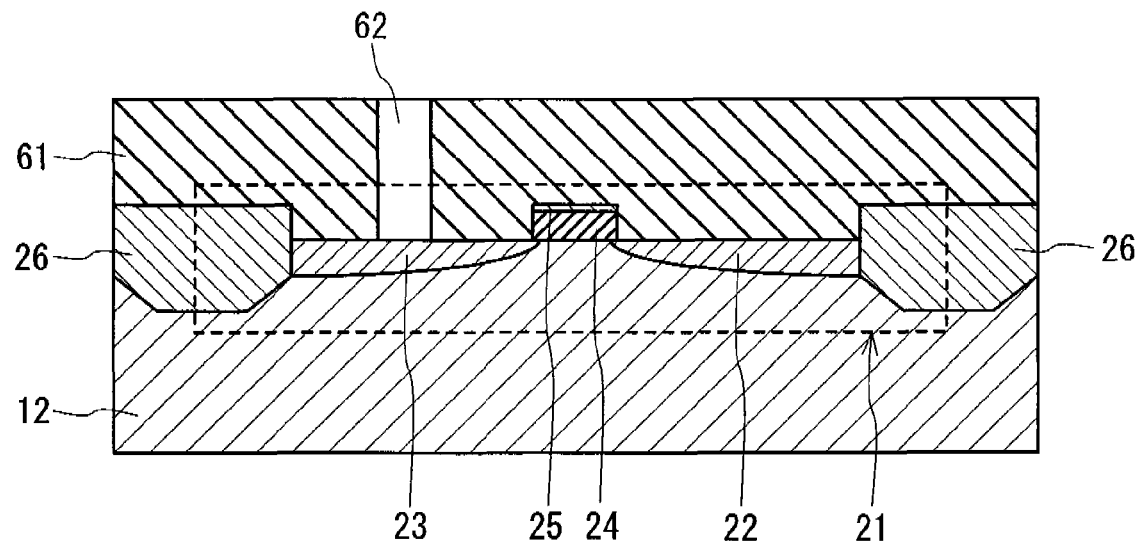
FIGS. 10A to 10H are process drawings schematically illustrating an example of the method of manufacturing an electro-resistance element according to the present invention.

First, as shown in FIG. 10A, a protective insulation film 61 is deposited to overlay a transistor 21 on a surface of a substrate 12 on which the transistor 21 is formed. After planarizing the surface of the deposited film 61 by a technique such as CMP, an opening 62 for a plug is formed by selectively etching through the film 61.

The film 61 may be made of, for example, $SiO_2$, and more specifically $SiO_2$ film (TEOS film) formed by TEOS (tetraethyl orthosilicate) and $O_3$ (ozone). Any common technique may be employed for forming the transistor 21 on the surface of the substrate 12. The transistor 21 shown in FIG. 10A is a common MOS-FET including a source 22, a drain 23, a gate insulating film 24, a gate electrode 25 and an element isolating section 26. The opening 62 may be formed to expose the drain 23 of the transistor 21.

Figure 10B:
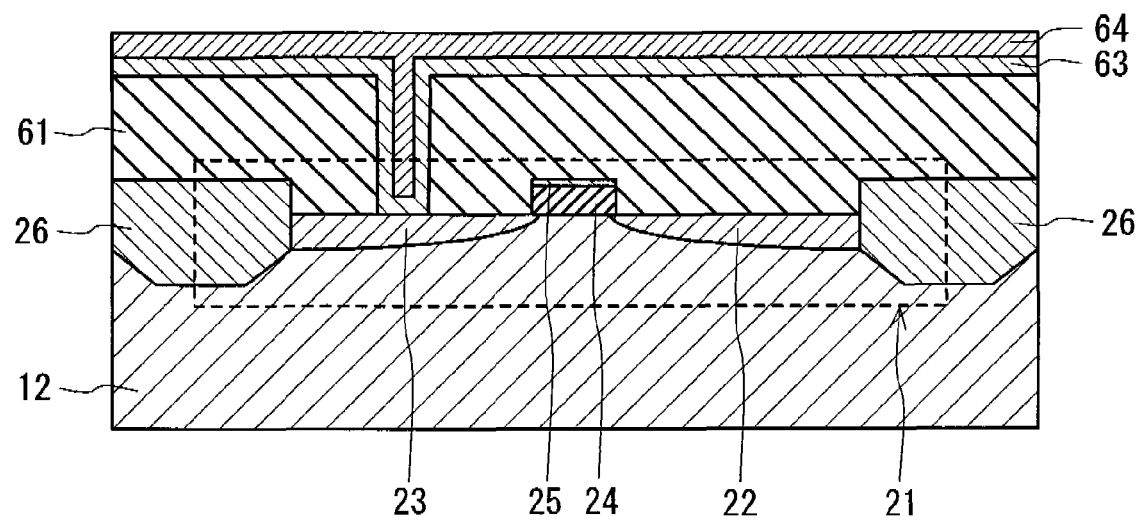

Next, as shown in FIG. 10B, on the surface of the film 61, a barrier metal 63 and a plug metal 64 are deposited in this order. For a material for the barrier metal 63, a material functioning to restrict diffusion of the plug metal 64 or to enhance adhesion with the neighboring insulating layers, or a material functioning as a seed when the plug metal 64 is formed by plating, may be used. For example, a stacked structure made of titanium (Ti) film and titanium nitride (Ti—N) film or that made of tantalum (Ta) film and tantalum nitride (Ta—N) film may be used. A material basically having an excellent electrical conductivity for the plug metal 64, such as tungsten, aluminum and copper, may be used. The plug metal 64 may be deposited to fill the opening 62.

Figure 10C:
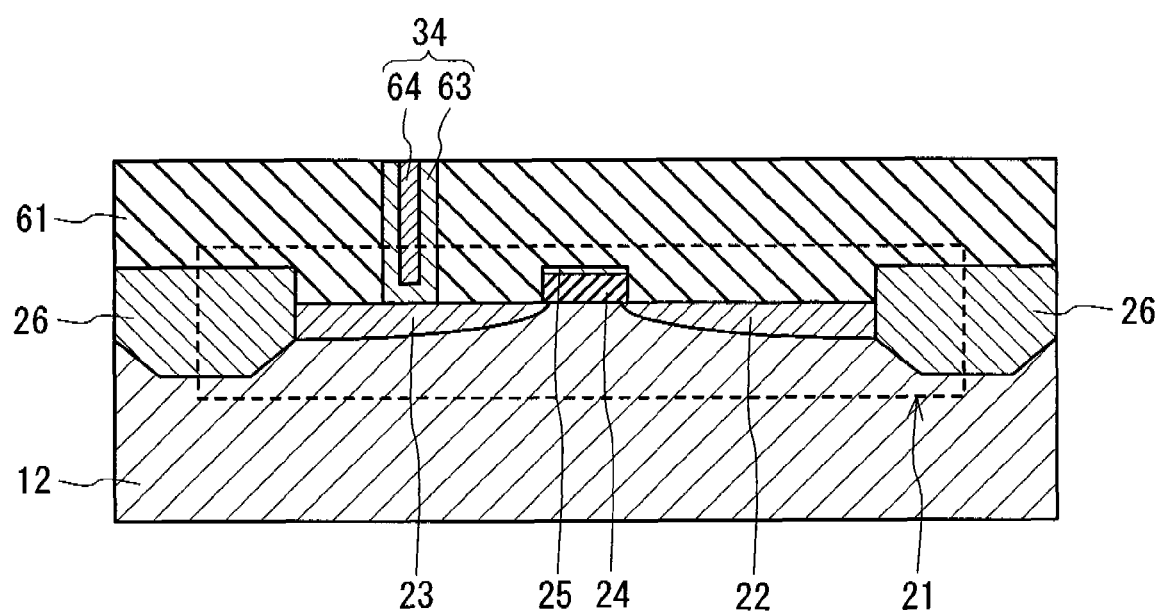

Then, as shown in FIG. 10C, the parts of the deposited barrier metal 63 and the plug metal 64 that were formed on top of the film 61 are removed by a technique such as CMP, so that a plug 34, which is connected electrically to the drain 23, is formed.

Figure 10D:
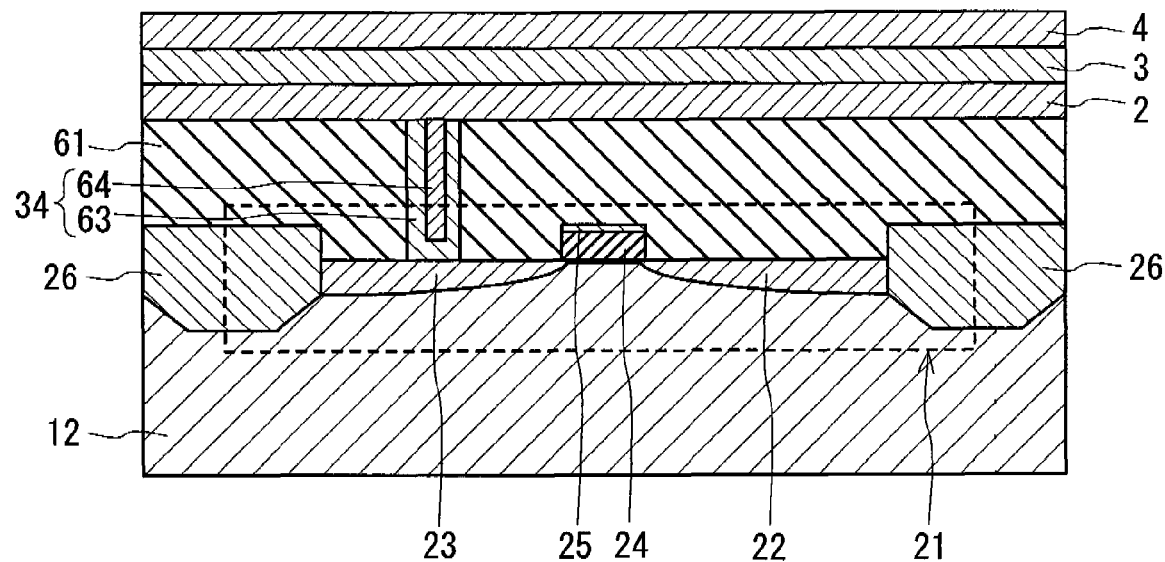

Then, as shown in FIG. 10D, a lower electrode 2, an electro-resistance layer 3 and an upper electrode 4 are formed on the surfaces of the plug 34 and the film 61 in this order. The lower electrode 2 may be formed to secure an electrical connection with the plug 34.

Figure 10E:
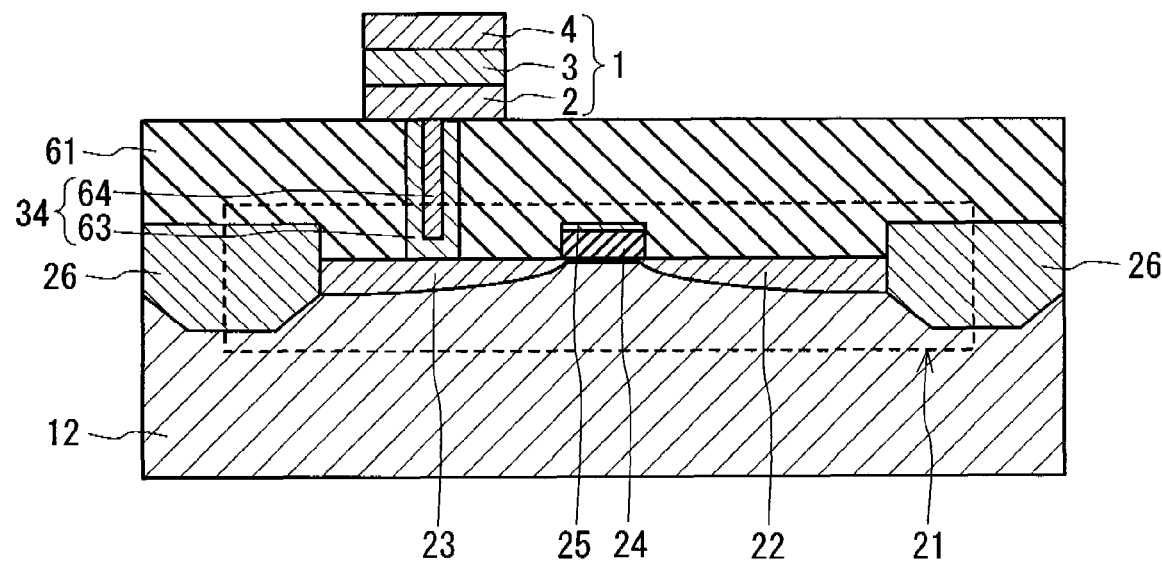

Then, as shown in FIG. 10E, the lower electrode 2, the layer 3 and the upper electrode 4 that were formed are micro-fabricated in predetermined shapes.

Figure 10F:
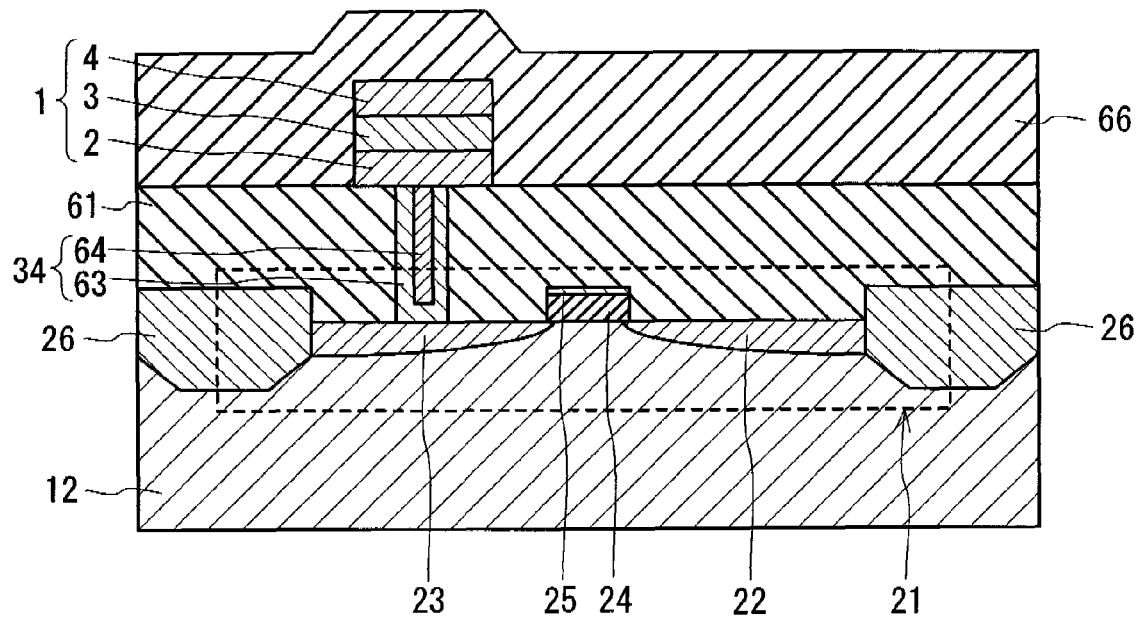

Then, as shown in FIG. 10F, a protective insulation film 66 is deposited on the film 61 to overlay the stacked structure 11 of the lower electrode 2, the layer 3 and the upper electrode 4. The film 66 may be made of the above TEOS film or the like.

Figure 10G:
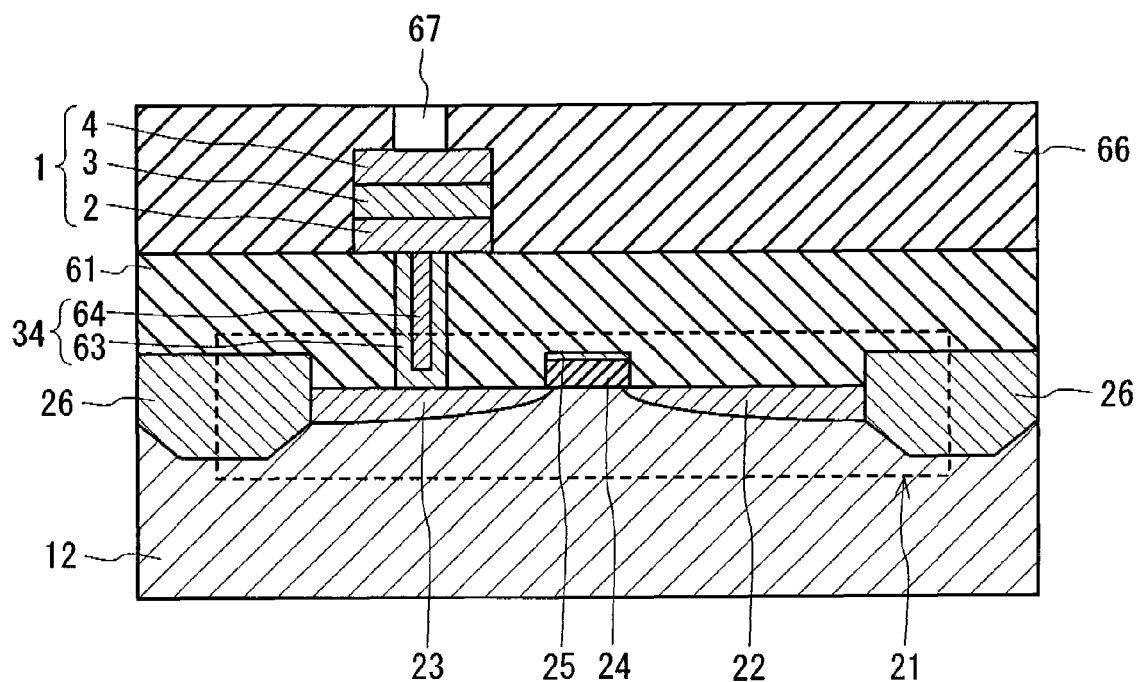

Then, as shown in FIG. 10G, after planarizing the surface of the film 66 by a technique such as CMP, an opening 67 for a plug is formed by selectively etching through the film 66. The opening 67 may be formed to expose the upper electrode 4.

Figure 10H:
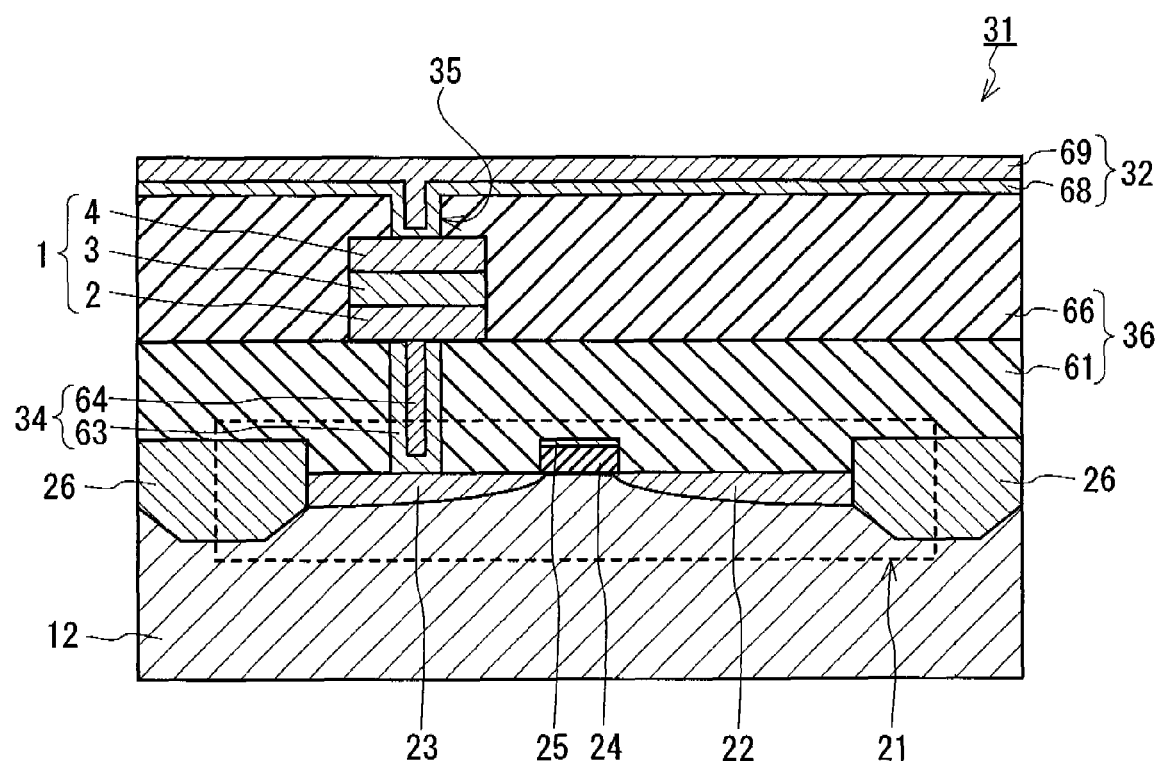

Then, as shown in FIG. 10H, an adhesive metal 68 and a wiring metal 69 are deposited on the surface of the film 66 in this order to form a bit line 32 and a plug 35, which electrically connects the bit line 32 with the upper electrode 4. As a material for the adhesive metal 68, a material functioning to enhance adhesion with the neighboring insulating layers, or a material functioning as a seed when the wiring metal 69 is formed by plating, may be used. For example, a stacked structure made of titanium (Ti) film and titanium nitride (Ti—N) film or that made of tantalum (Ta) film and tantalum nitride (Ta—N) film, or nitrocarburized silicon (Si—C—N) may be used. A material basically having an excellent electrical conductivity, such as tungsten, copper and aluminum may be used for the wiring metal 69. The wiring metal 69 may be deposited to fill the opening 67 and to form the bit line 32. In this way, a memory element 31 shown in FIG. 4 can be formed. The films 61 and 66 configure the layer 36 shown in the FIG. 4.

In the method shown in FIGS. 10A to 10H, not only during the heat treatment under the hydrogen-containing atmosphere with the purpose of stabilization of ON resistance value of the transistor but also during every deposition or film forming step under a gas atmosphere including hydrogen, such as deposition of tungsten employed for the plug metal 64 or the wiring metal 69, the element 1 is exposed to hydrogen.

In the method shown in FIGS. 10A to 10H, for example, a solid solution made of the first and the second elements and nitrogen may be formed as the electro-resistance layer 3. In some cases, however, such layer 3 has a possibility to increase a leakage current, which does not contribute to the characteristics as a memory element, i.e. memory characteristics, as its thickness gets thinner. In such a case, the leakage current can be reduced by forming the layer 3 including an oxynitride. As a possible reason for the reduction in the leakage current can be reduced by including the oxynitride, the principles shown in the following (1) and (2) are considered so far.

Figure 11A:
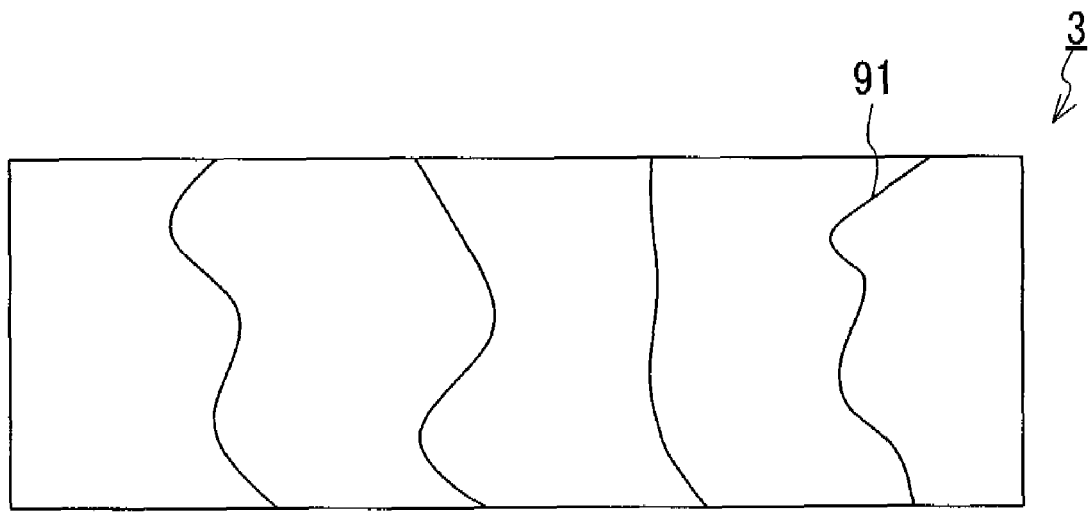
FIGS. 11A and 11B are schematic view illustrating an example of the structure of an electro-resistance layer in an electro-resistance element.
Figure 11B:
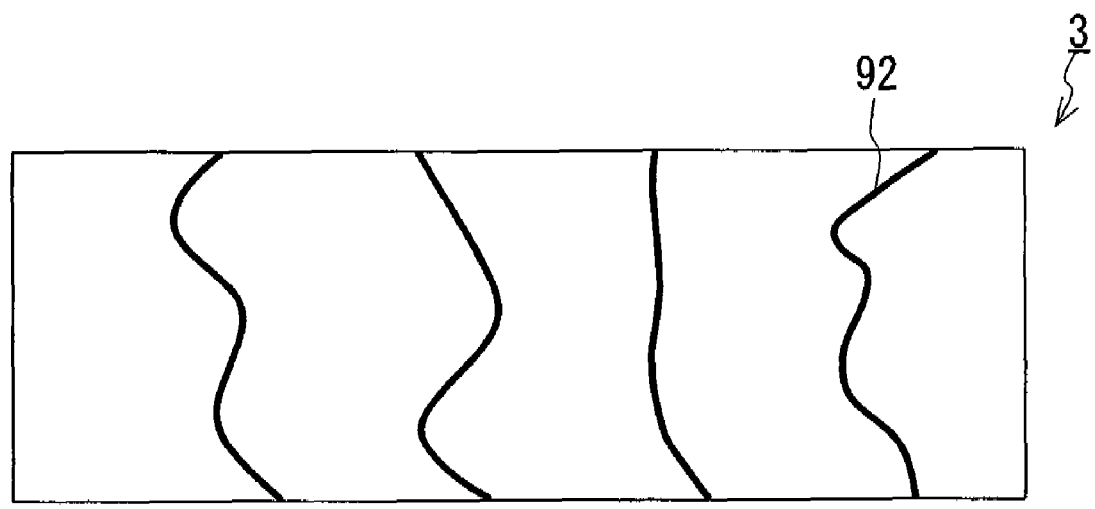

(1) There is a possibility that grain boundaries 91 in the layer 3, shown in FIG. 11A, become paths for the leakage current. As shown in FIG. 11B, the leakage current can be reduced by having the oxynitride at grain boundaries 92, i.e. by including the oxynitrided grain boundaries 92 in the layer 3.

Figure 12A:
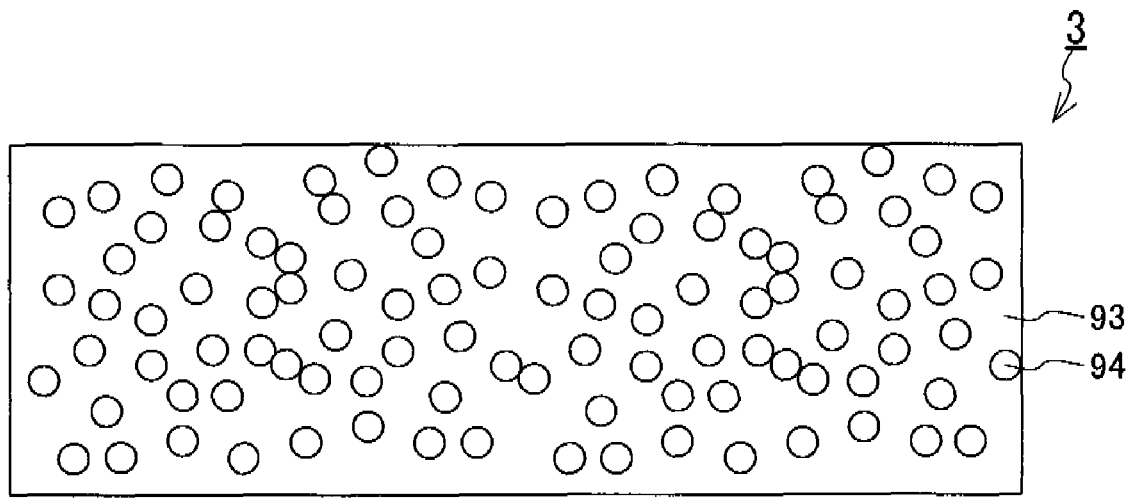
FIGS. 12A and 12B are schematic views illustrating another example of the structure of an electro-resistance layer in an electro-resistance element.
Figure 12B:
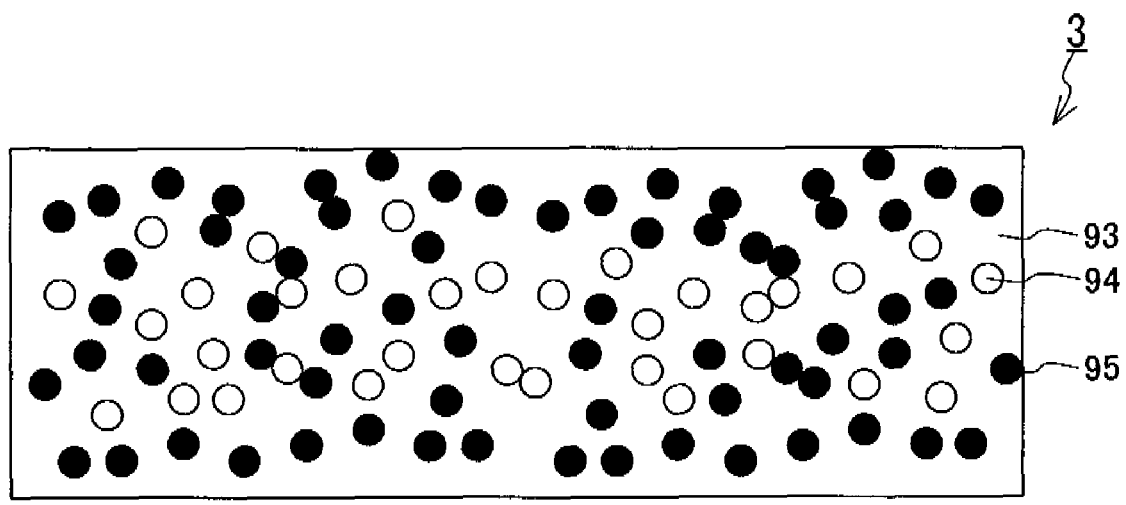

(2) As shown in FIG. 12A, the layer 3 has a granular structure where a domain 94 of the nitride A, which is relatively low in resistance, dispersed in a matrix 93 of the nitride B, which is relatively high in resistance. In this case, there is a possibility that a hopping-like conduction is developed through the domains 94 of the nitride A. As shown in FIG. 12B, the leakage current can be reduced by having at least a part of the domain made of an oxynitride, i.e. by including an oxynitrided domain 95 in the layer 3.

In order to form the layer 3 including an oxynitride, for example, the layer 3 made of an oxynitride may be formed or the layer 3 made of an nitride may be heat treated under an oxygen atmosphere, in the step shown in FIG. 10D. This also applies in the step shown in FIG. 14G, described below.

Figure 13A:
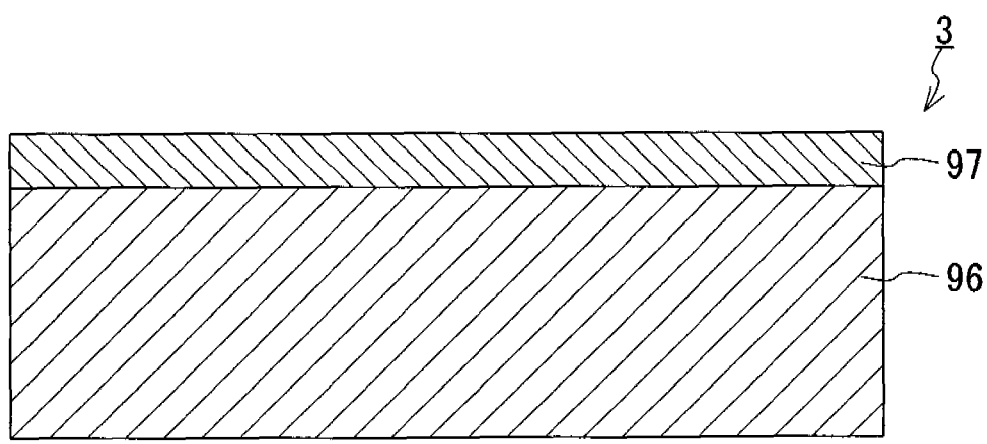
FIGS. 13A to 13F are schematic views illustrating an example of the configuration of the electro-resistance layer in the electro-resistance element of the present invention.
Figure 13B:
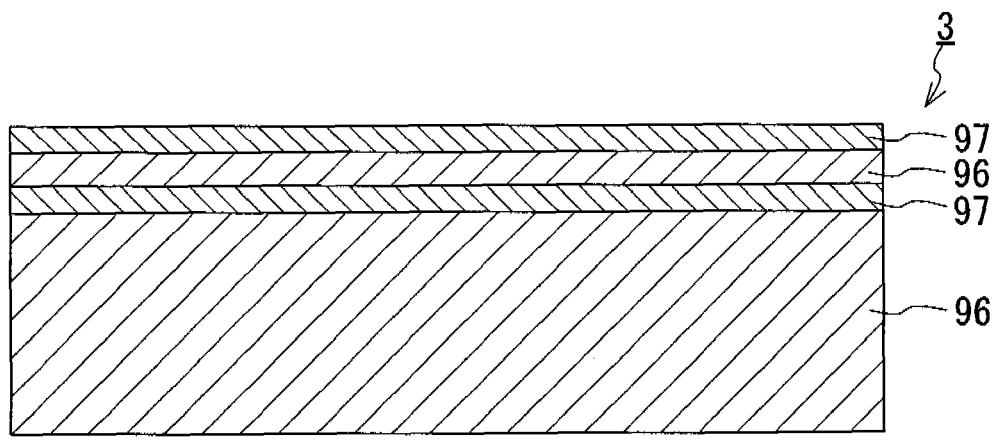
Figure 13C:
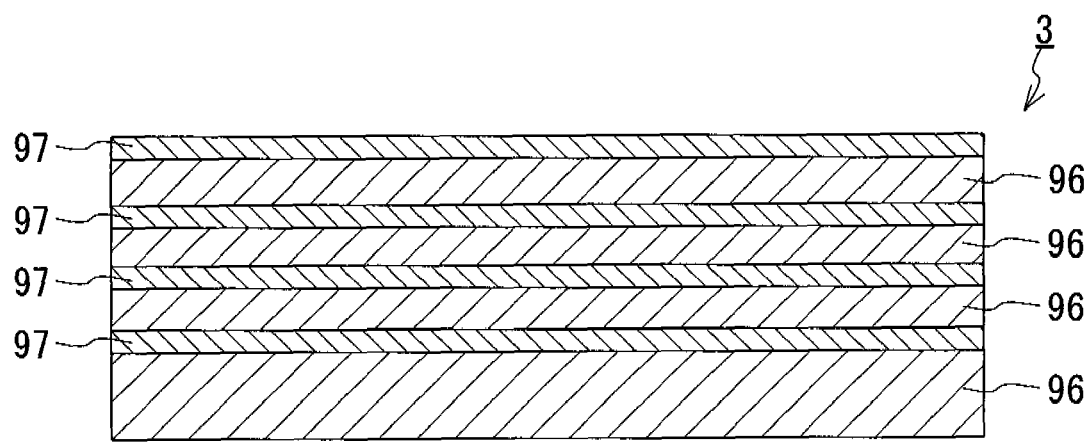
Figure 13D:
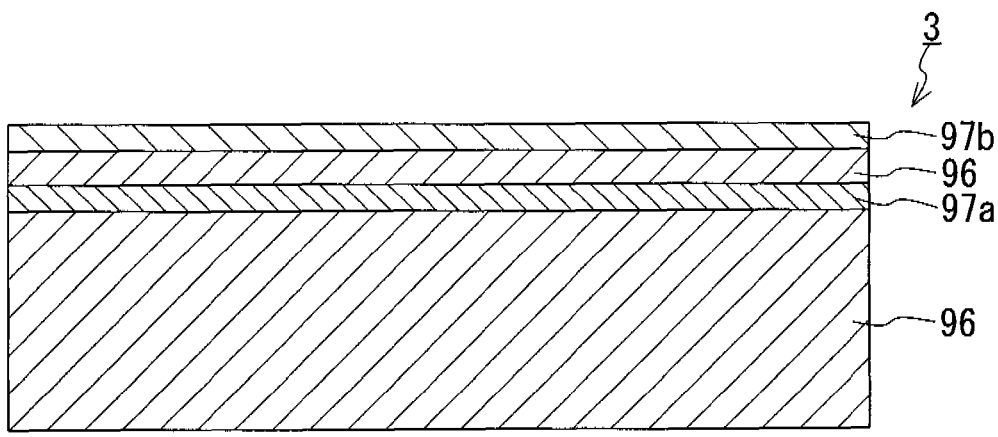
Figure 13E:
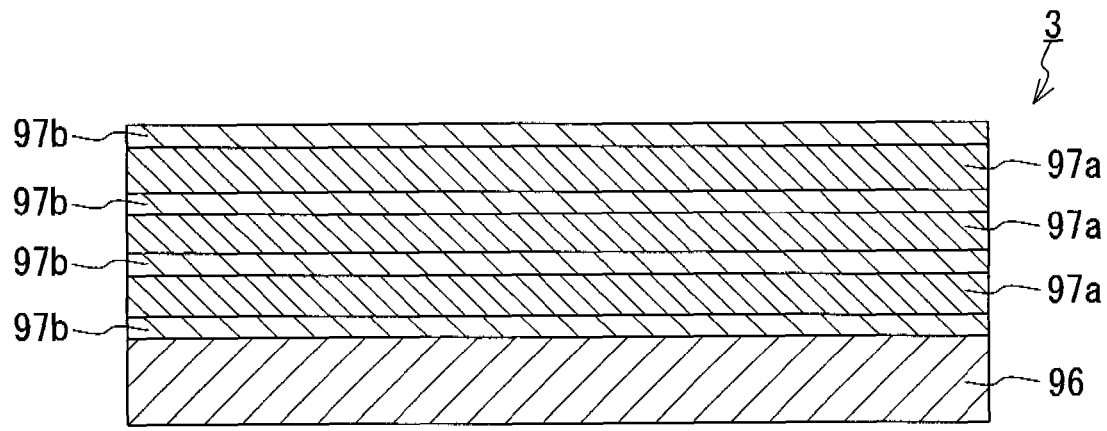
Figure 13F:
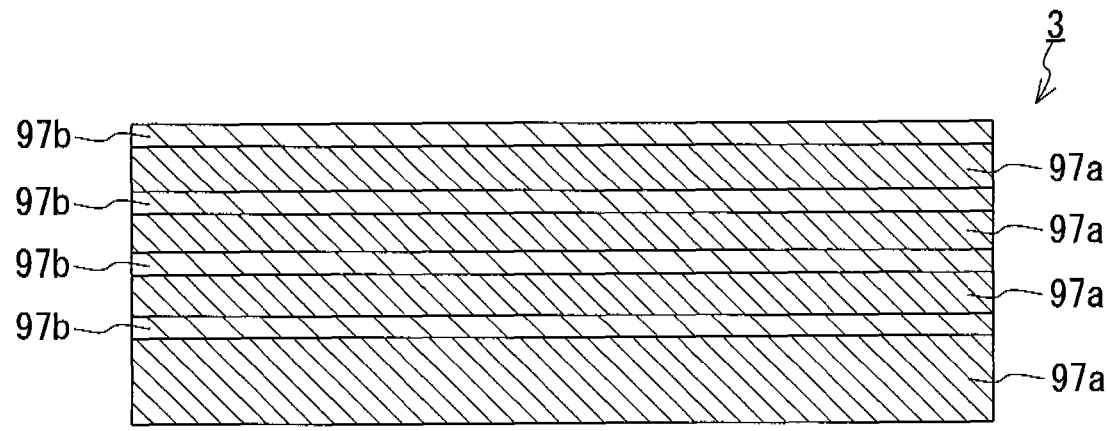

As shown in FIG. 13A, it is also possible to reduce the leakage current by having the layer 3 including a nitride film 96 and an oxynitride film 97. In this case, the layer 3 may include two or more of the oxynitride films 97 (see FIG. 13B) or may be formed by stacking the nitride film 96 and the oxynitride film 97 alternately (see FIG. 13C). The layer 3 may include oxynitride films 97a and 97b having two or more of different compositions (see FIG. 13D), may be formed by stacking the oxynitride films 97a and 97b alternately (see FIGS. 13E and 13F) or may be made of oxynitride films only (see FIG. 13F) as well.

Another example of a method of manufacturing the electro-resistance element of the present invention is shown in FIGS. 14A to 14K, as an example of that of manufacturing a memory element in which the electro-resistance element of the present invention is incorporated.

Figure 14A:
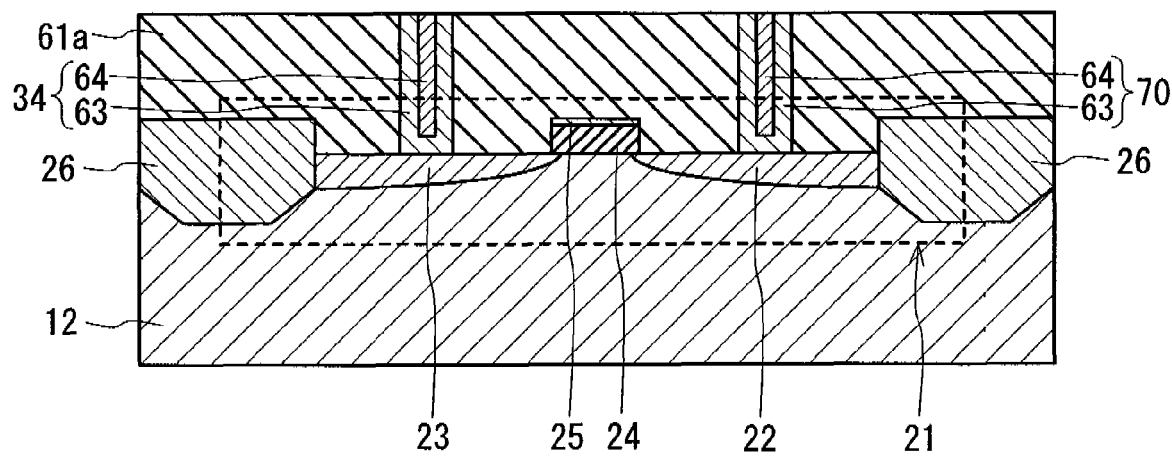
FIGS. 14A to 14K are process drawings schematically illustrating another example of the method of manufacturing an electro-resistance element according to the present invention.

First, similar to the steps shown in FIGS. 10A to 10C, a protective insulation film 61a is deposited on a surface of a substrate 12 on which the transistor 21, which is a MOS-FET, is formed as shown in FIG. 14A. On the deposited film 61a, a plug 34 electrically connected to a drain 23 of the transistor 21 and a plug 70 electrically connected to a source 22 of the transistor 21 are formed. The plug 70 may be formed in the same manner as the plug 34.

Figure 14B:
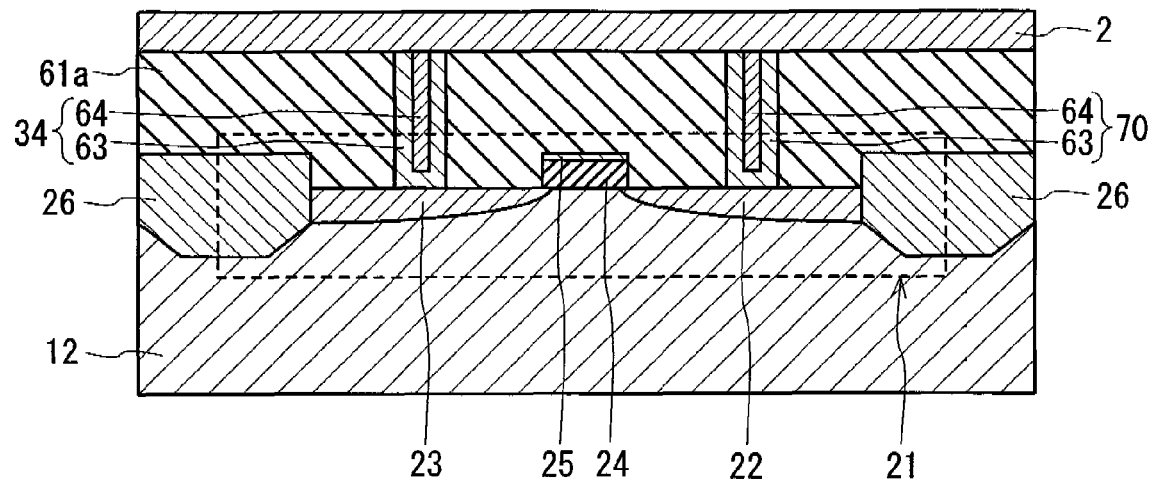

Next, as shown in FIG. 14B, a lower electrode 2 is formed on the film 61a, the plug 34 and the plug 70. The lower electrode 2 may be formed to secure an electrical connection with the plug 34.

Figure 14C:
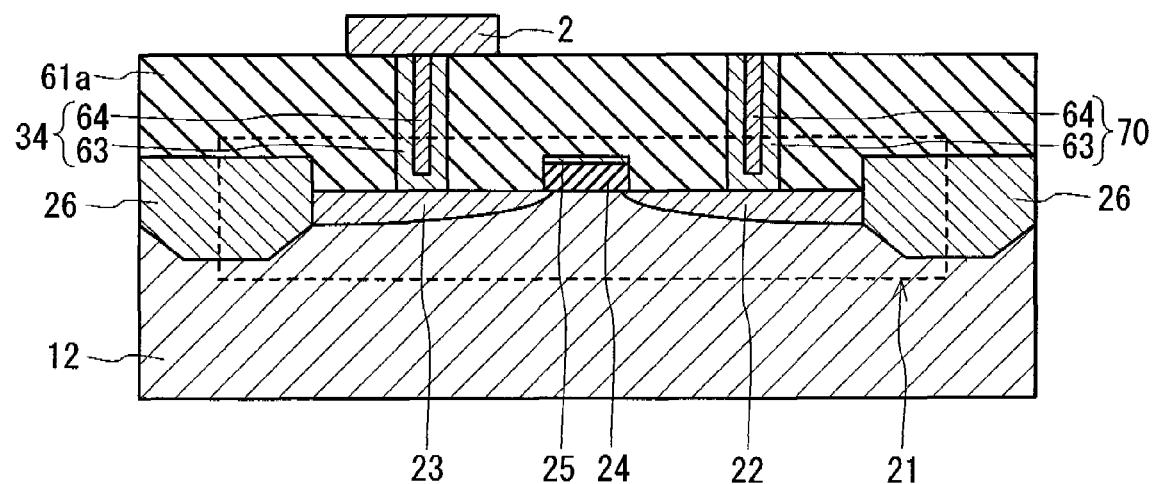

Then, as shown in FIG. 14C, the lower electrode 2 is removed by a technique, such as etching, except the part right above the plug 34.

Figure 14D:
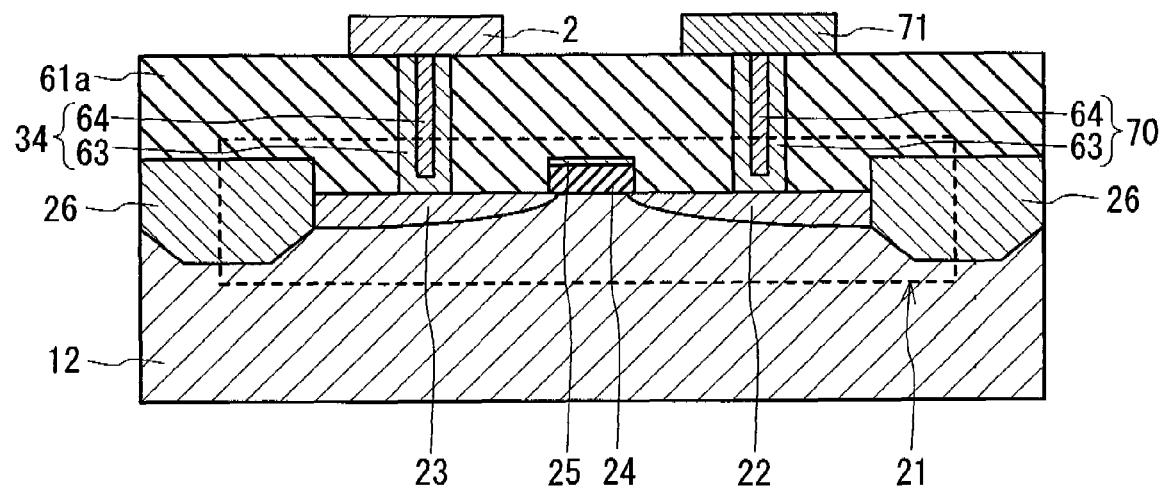

Then, as shown in FIG. 14D, an electrode 71, which connects the source 22 to a bit line 32 to be formed in a later step, is formed on the surface of the plug 70 to secure electrical connection thereto. The electrode 71 basically may be made of a material having an electrical conductivity.

Figure 14E:
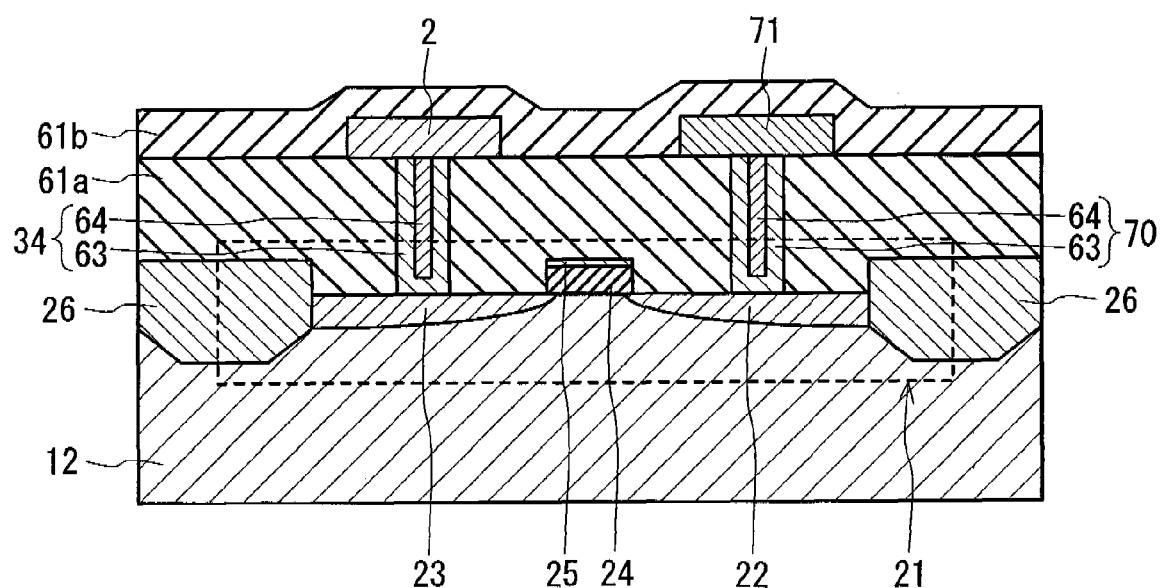
Figure 14F:
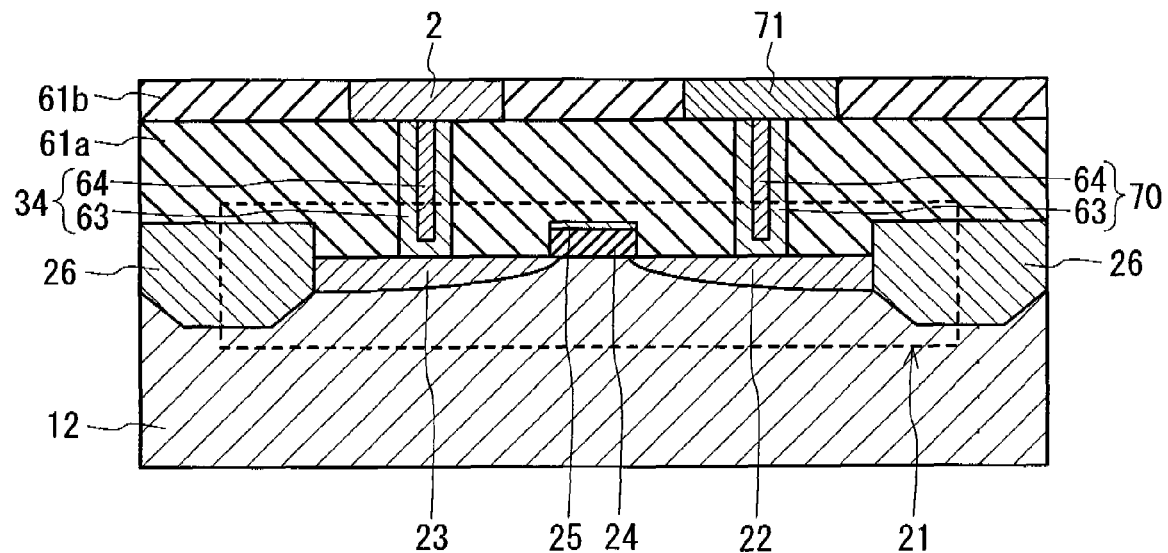

Then, after depositing a protective insulation film 61b on the film 61a to overlay the lower electrode 2 and the electrode 71 as shown in FIG. 14E, the lower electrode 2 and the electrode 71 are exposed after planarizing the surface of the film 61b by a technique, such as CMP, as shown in FIG. 14F.

Figure 14G:
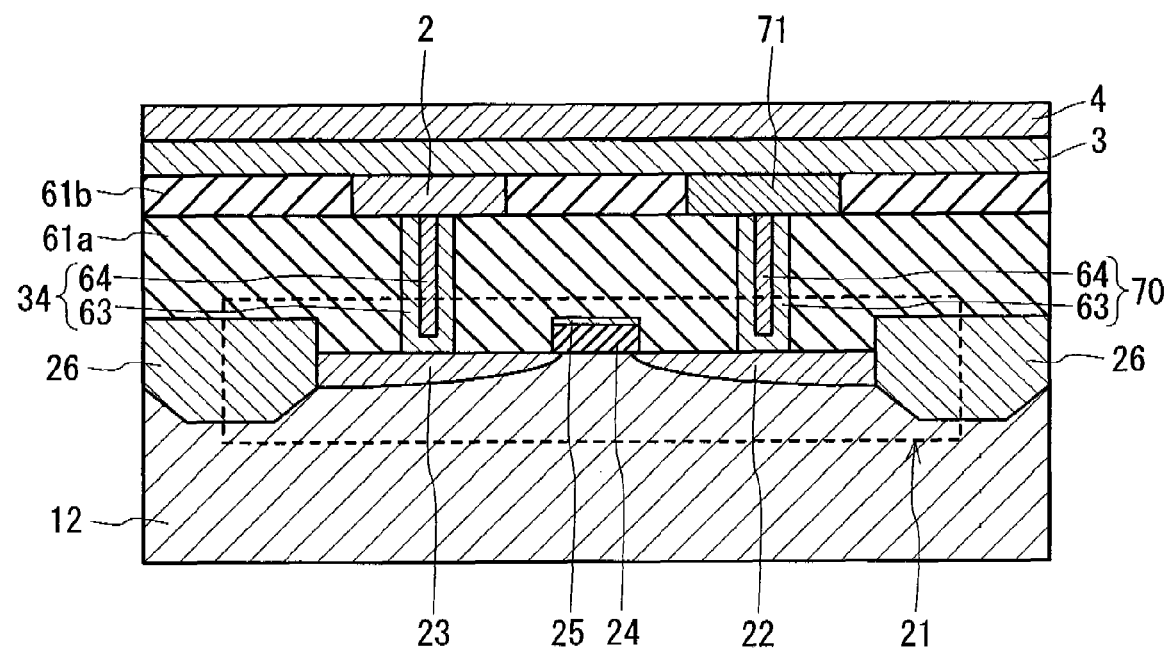

Then, as shown in FIG. 14G, an electro-resistance layer 3 and an upper electrode 4 are formed on the film 61b, the lower electrode 2 and the electrode 71.

Figure 14H:
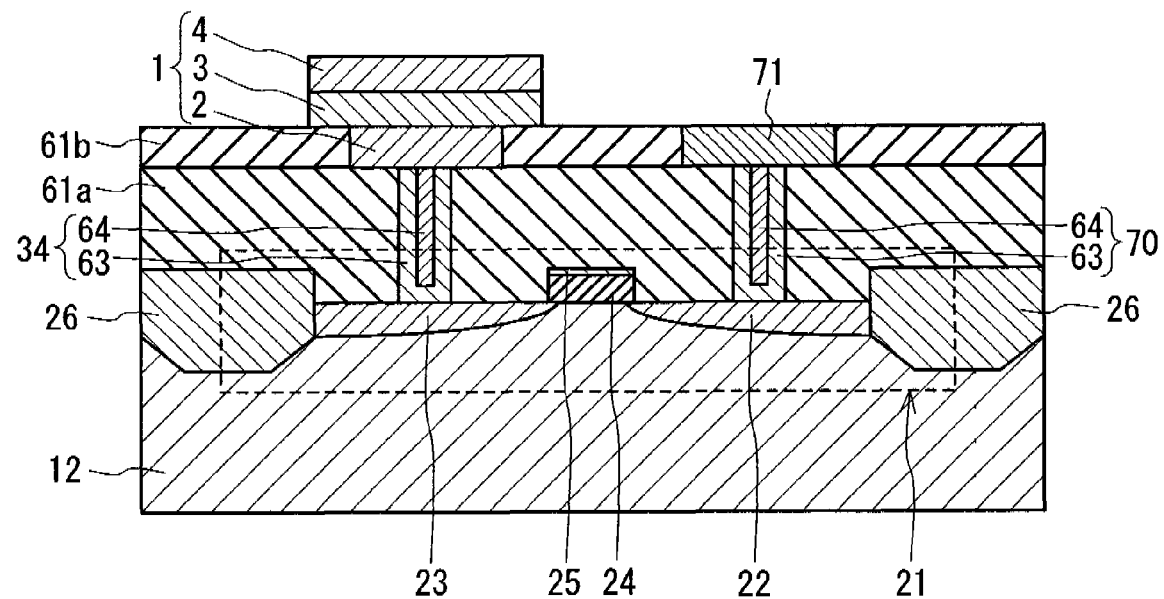

Then, as shown in FIG. 14H, the layer 3 and the upper electrode 4 are micro-fabricated in predetermined shapes.

Figure 14I:
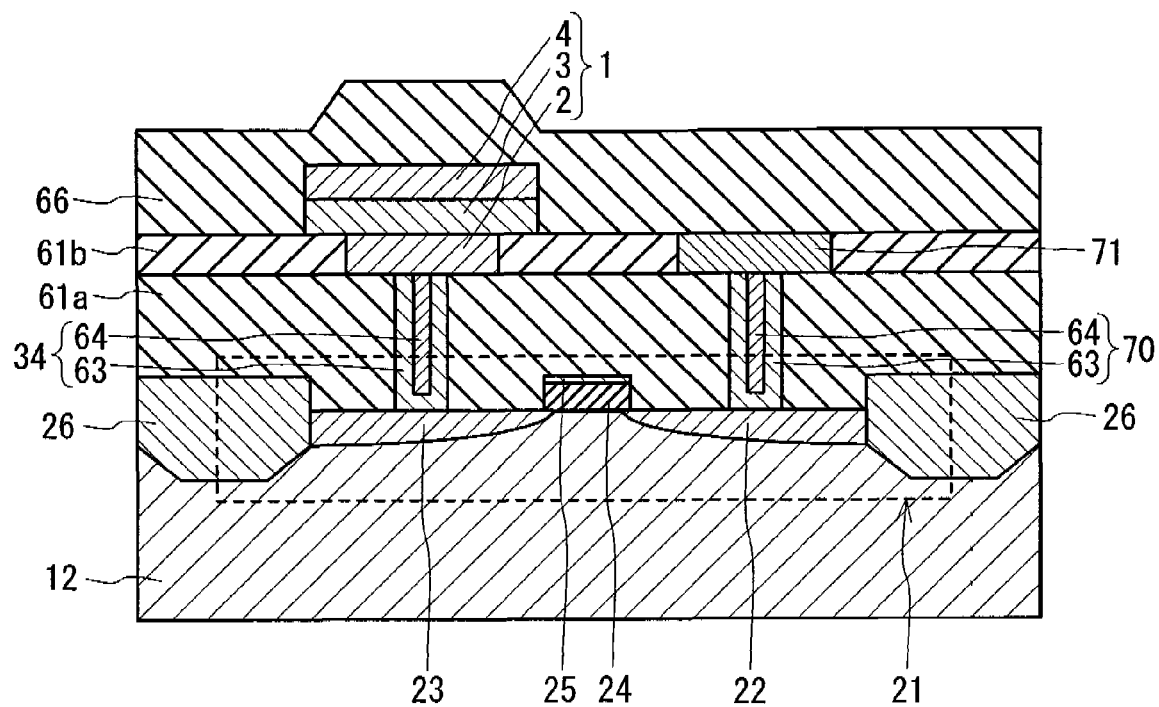

Then, as shown in FIG. 14I, a protective insulation film 66 is formed on the film 61b and the electrode 71 to overlay the layer 3 and the upper electrode 4.

Figure 14J:
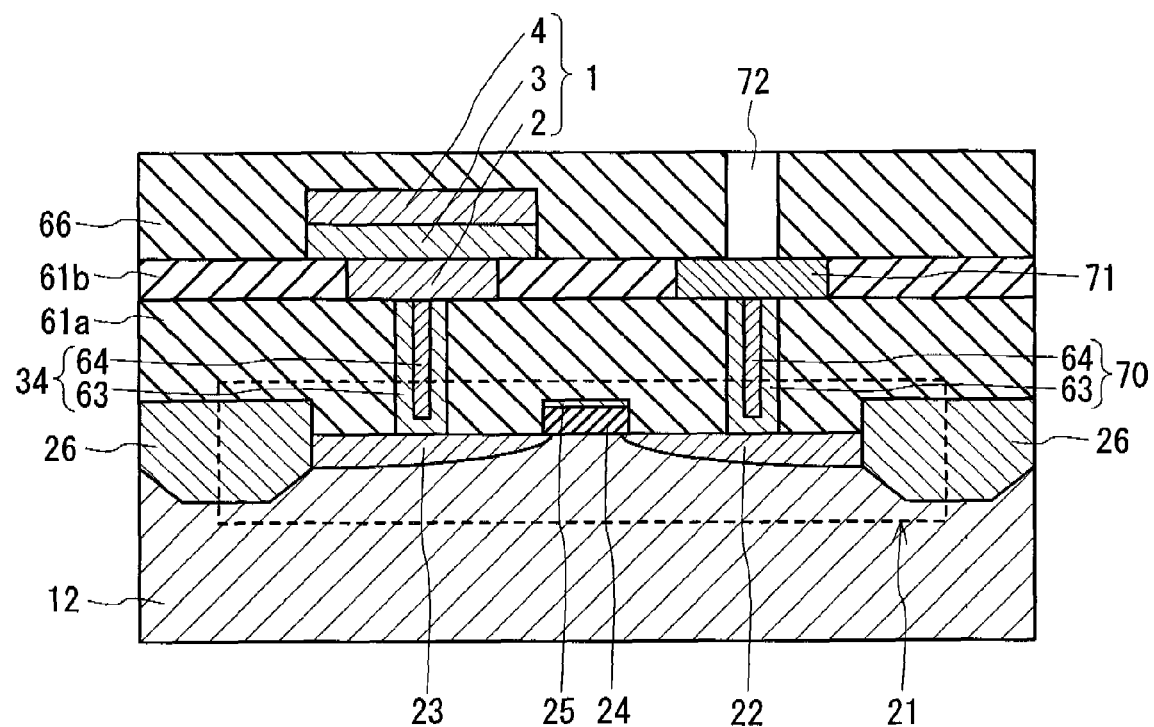

Then, as shown in FIG. 14J, after planarizing the surface of the film 66 by a technique such as CMP, an opening 72 for a plug is formed by selective etching the film 66. The opening 72 may be formed to expose the electrode 71.

Figure 14K:
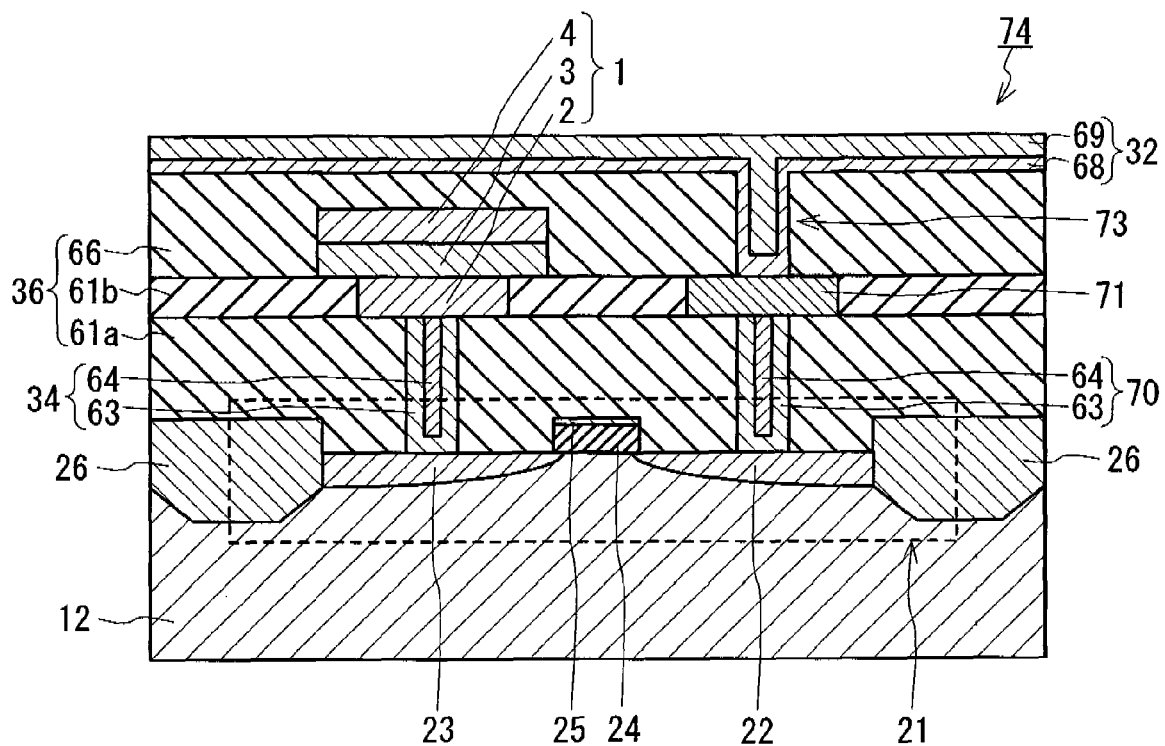

Then, as shown in FIG. 14K, an adhesive metal 68 and a wiring metal 69 are deposited on the surface of the film 66 in this order to form a bit line 32 and a plug 73 electrically connecting the bit line 32 with the electrode 71. The wiring metal 69 may be deposited to fill the opening 72 and to form the bit line 32. In this way, a memory element 74 having a different configuration from that of the memory element 31 shown in FIG. 4 can be formed.

EXAMPLES

Hereinbelow, the present invention is described in further detail with reference to Examples. It should be noted that the present invention is not limited to Examples described below.

Example 1

In Example 1, an electro-resistance element 1 having a configuration shown in FIG. 1 was fabricated and its resistance change characteristics were evaluated. In addition, in Example 1, by forming the electro-resistance layer 3 including a nitride solid solution made of Ti as the first element, Al as the second element and nitrogen, nine samples (samples 1-1 to 1-9), in each of which a weight ratio Z of Al content $X_2$ (wt. %) in the solid solution to a sum of Ti content $X_1$ (wt. %) in the solid solution and the Al content $X_2$ ($Z = X_2/(X_1+X_2)$) was varied, were fabricated to evaluate the resistance change ratio of each sample. A specific method for fabricating the evaluated sample is illustrated with reference to FIGS. 15A to 15E.

Figure 15A:
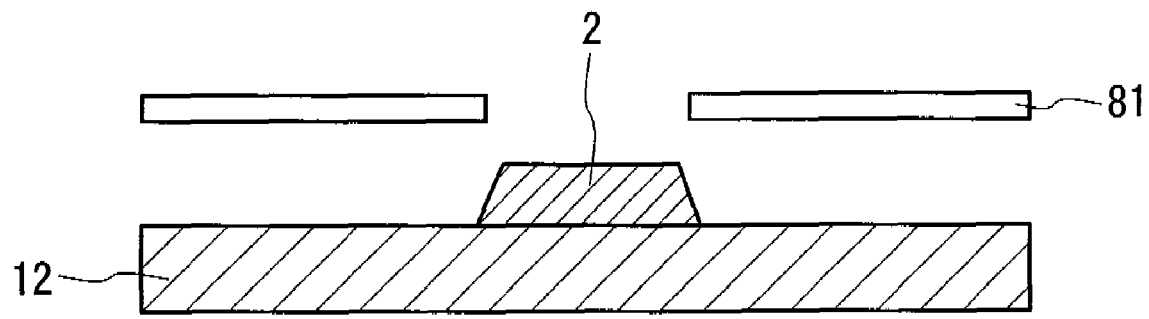
FIGS. 15A to 15E are process drawings schematically illustrating the method of manufacturing the sample of the electro-resistance element according to the present invention fabricated in Examples.

First, a Si substrate with a thermally oxidized film (a SiO$_2$ film: not shown) formed on its surface as a substrate 12 was prepared, and a metal mask A81 having an opening fitting into the shape of a lower electrode 2 to be formed, was disposed on the prepared Si substrate to form a TiN layer with a thickness of 400 nm as the lower electrode 2 as shown in FIG. 15A. A typical opening is in a rectangular shape, and each side of the rectangle has a length of about three times of that of the element junction (junction area). In a case of forming an element having a junction area of 1 μm by 1 μm, an example of its opening may have a rectangular part of 7 μm in width by 20 μm in length and a polygonal part, which corresponds to wiring for pad drawing and a contact pad section.

The TiN layer as the lower electrode 2 was formed by using Ti as a target and by magnetron sputtering under a nitrogen-argon mixture atmosphere (nitrogen:argon (partial pressure ratio)=approximately 4:1) at a pressure of 0.1 Pa, setting a temperature of the Si substrate in the range between 0° C. and 400° C. (mainly at 350° C.) and the applied electric power at DC 4 kW.

Figure 15B:
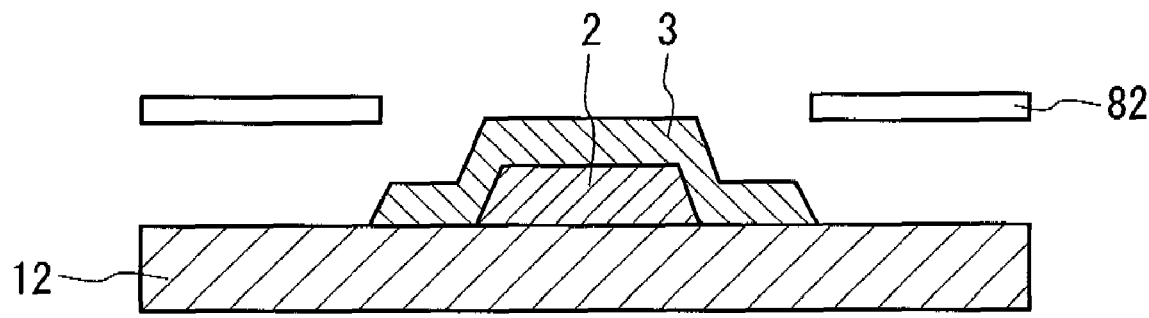

Next, after removing the metal mask A81, a metal mask B82 having a square opening is disposed to overlay a part of the formed lower electrode 2, and a Ti—Al—N layer (TAN layer), with a thickness of 2 nm to 200 nm: typically 50 nm, is formed as an electro-resistance layer 3 on the lower electrode 2 as shown in FIG. 15B. The mask B82 was disposed to match the center of its opening (hereinafter, in a rectangular object, the point of intersection of two linear lines connecting the opposing vertexes is defined as the center of the object) with the center of the lower electrode 2.

The TAN layer as the layer 3 was formed by using a Ti—Al alloy as a target and by magnetron sputtering under an nitrogen-argon mixture atmosphere (nitrogen:argon (partial pressure ratio)=approximately 4:1) at a pressure of 0.1 Pa, setting a temperature of the Si substrate in the range between 250° C. and 400° C. (mainly at 350° C.) and the applied electric power at DC 5 kW. Here, nine TAN layers, each having the different weight ratio Z were fabricated individually by altering the composition of the Ti—Al alloy used as a target (samples 1-1 to 1-9, see Table 1 below for the weight ratio Z of each sample).

The configuration of the formed layer 3 was evaluated by resistance measurement, X-ray photoelectron spectroscopy (XPS), energy dispersive analysis by X-ray (EDAX) and X-ray diffraction analysis, and it was a solid solution made of Ti, Al and nitrogen.

Figure 15C:
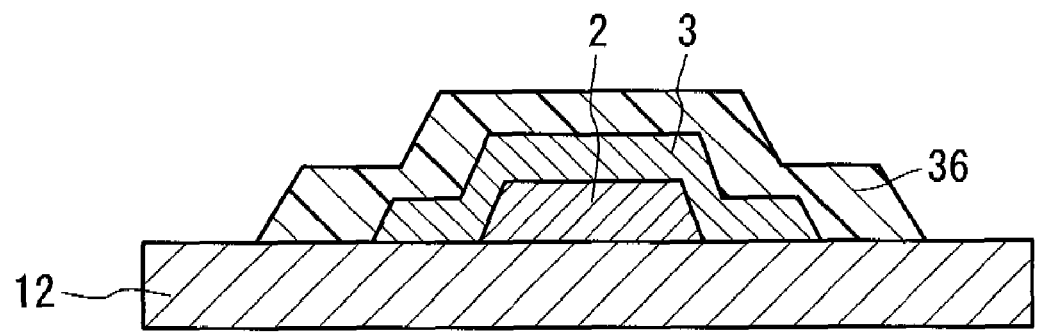

Then, after removing the mask B82, the TEOS film above with a thickness of 400 nm was disposed to overlay the TAN layer as the layer 3 for forming an interlayer insulating layer 36, as shown in FIG. 15C.

Figure 15D:
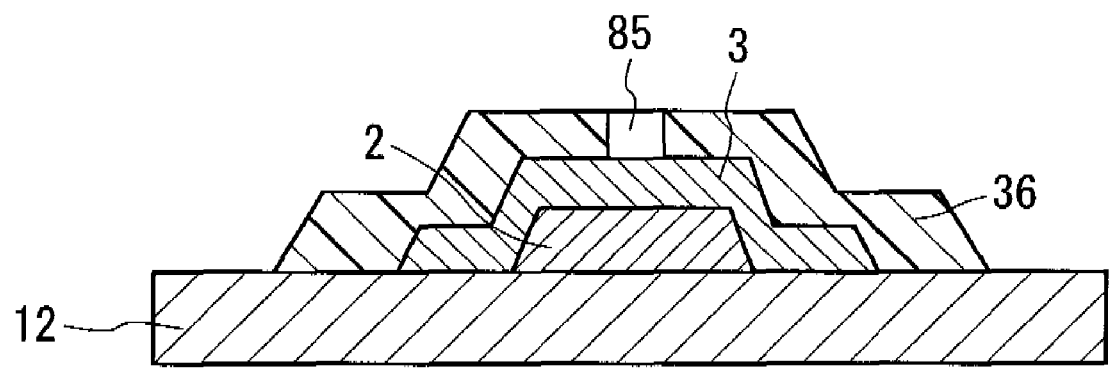

Then, by photolithography and dry etching, an opening 85 for forming an element junction was formed to expose the layer 3, as shown in FIG. 15D. The area of the opening 85 was varied in the range of 1 μm by 1 μm to 0.1 mm by 0.1 mm (typically 10 μm by 10 μm). The area of the opening 85 makes the junction area of the element 1.

Figure 15E:
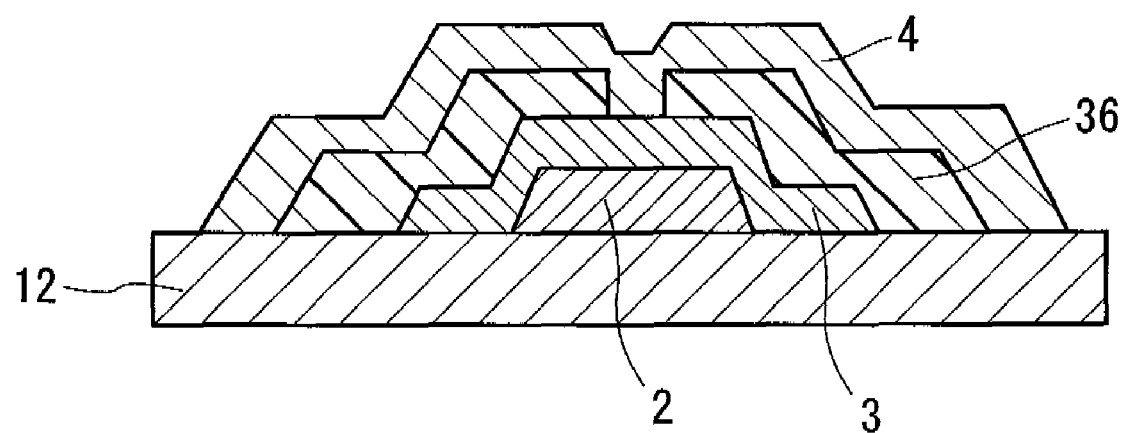

Then, the electro-resistance element 1 having the sectional structure shown in FIG. 15E was fabricated by forming a TiN layer as the upper electrode 4 to make contact with the exposed layer 3. The TiN layer was formed similarly to the lower electrode 2.

Figure 16:
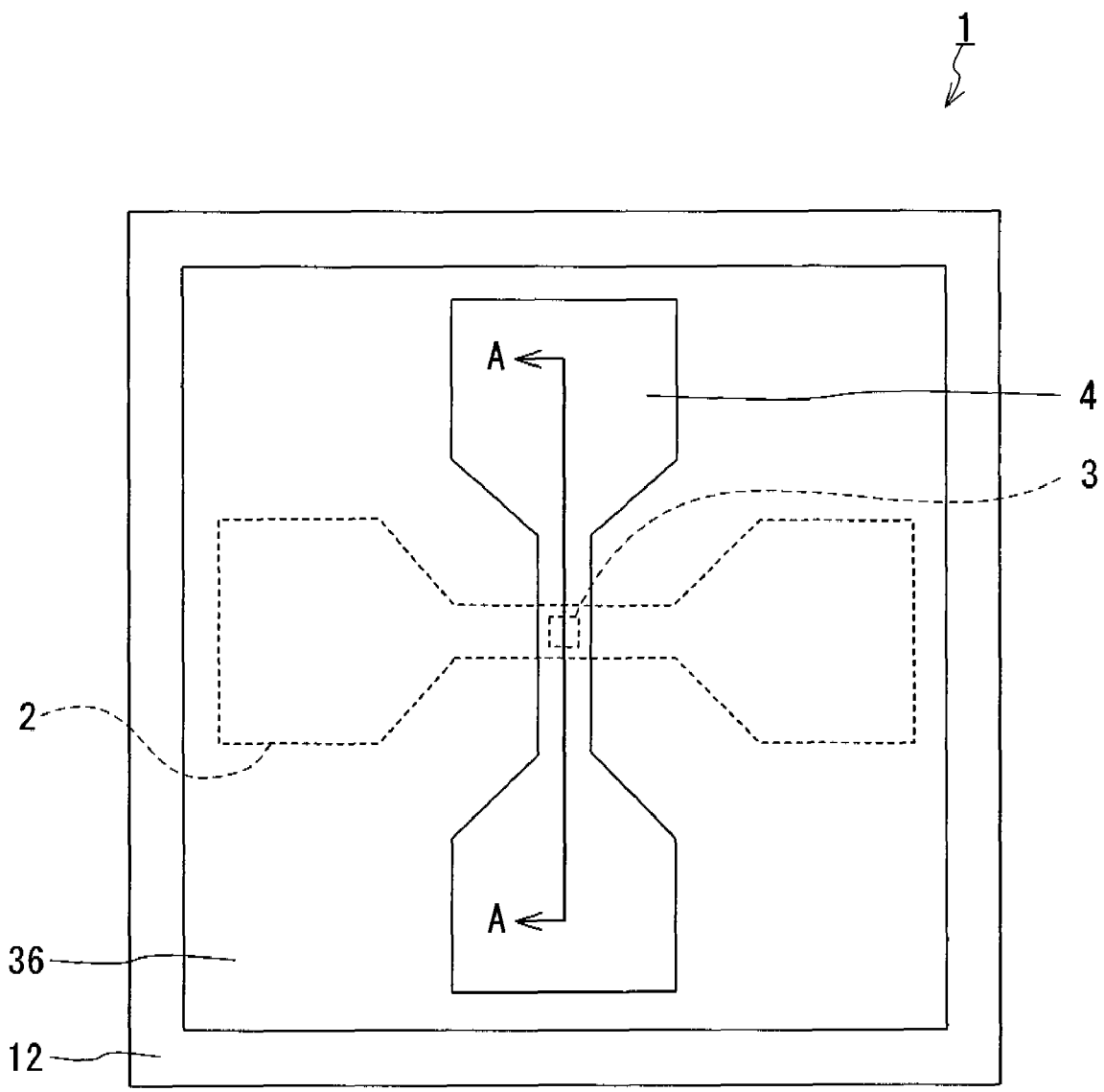
FIG. 16 is a plan view schematically illustrating the sample of the electro-resistance element according to the present invention fabricated in Examples.

FIG. 16 is a plan view of the fabricated element 1 taken in the direction of the upper electrode 4. A cross-section A-A in FIG. 16 corresponds to FIG. 15E.

Separately from the nine element samples (samples 1-1 to 1-9) fabricated in the above manner, an element having its electro-resistance layer made of AlN (sample 1-10) and an element having its electro-resistance layer made of TiN (sample 1-11) were fabricated. The electro-resistance layers of both samples were fabricated in the same manner as the samples 1-1 to 1-9, except for using a Ti—N alloy and an Al—N alloy as each target respectively, and each layer except the electro-resistance layers in both samples was the same as that of the samples 1-1 to 1-9.

Pulsed voltages of SET, RESET and READ were applied to each sample fabricated in the above manner, via the lower and the upper electrodes as shown in FIG. 5 to evaluate the resistance change ratio. The evaluation method is described in the following.

(Evaluation Method of the Resistance Change Ratio)

Using a pulse generator, a voltage of 3 V (positive bias voltage) as the SET voltage, a voltage of −3V (negative bias voltage, magnitude 3 V) as the RESET voltage, and a voltage of 0.01 V (positive bias voltage) as the READ voltage were applied between the upper and the lower electrodes of each sample, where the pulse width of each voltage was 200 ns. After applying the SET voltage or the RESET voltage, the electric resistance value of each sample was calculated from the current values read through applying the READ voltage, and the resistance change ratio of each sample was obtained by the formula represented as $(R_{MAX}-R_{MIN})/R_{MIN}$, where $R_{MAX}$ is the maximum value of the calculated electric resistance values and $R_{MIN}$ is the minimum value thereof.

Results of the evaluation are shown in Table 1 below and FIG. 17.

TABLE 1

| Sample No. | Weight Ratio Z in Electro-resistance Layer 3 | Resistance Change Ratio (fold) (Before Heat Treatment) |
|---|---|---|
| 1-1 | 0.1 | Less than 0.01 |
| 1-2 | 0.2 | Less than 0.01 |
| 1-3 | 0.3 | Less than 0.01 |
| 1-4 | 0.4 | Less than 0.01 |
| 1-5 | 0.5 | 15 |
| 1-6 | 0.6 | 120 |

TABLE 1-continued

| Sample No. | Weight Ratio Z in Electro-resistance Layer 3 | Resistance Change Ratio (fold) (Before Heat Treatment) |
| --- | --- | --- |
| 1-7 | 0.7 | 500 |
| 1-8 | 0.8 | 700 |
| 1-9 | 0.9 | 60 |
| 1-10 | 1 (=AlN) | Less than 0.01 |
| 1-11 | 0 (=TiN) | Less than 0.01 |

*Weight Ratio $Z = X_2/(X_1 + X_2)$
$X_1$ denotes Ti content in the electro-resistance layer 3 (wt. %)
$X_2$ denotes Al content in the electro-resistance layer 3 (wt. %)

Figure 17:
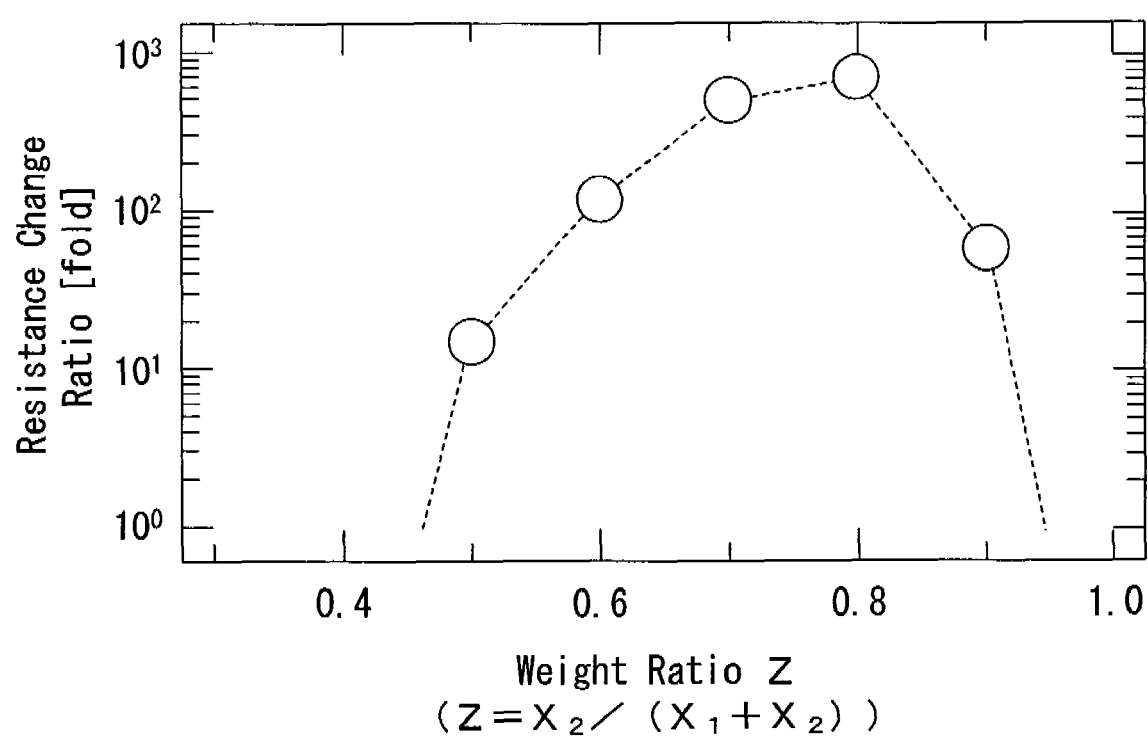
FIG. 17 is a drawing illustrating a relationship between the weight ratio Z and the resistance change ratio in the sample of the electro-resistance element according to the present invention fabricated in Examples.

As shown in Table 1 and FIG. 17, the resistance change ratios as high as ten fold or more were obtained with the samples having their weight ratio Z in the range of 0.5 to 0.9. In particular, the element showed a change larger than 100 fold in the resistance change ratio when the weight ratio Z was in the range of 0.6 to 0.8. Extremely high resistance change ratios were obtained, as large as a 500 fold change with the sample 1-7 having the ratio Z of 0.7, and as large as a 700 fold change with the sample 1-8 having the ratio Z of 0.8.

On the other hand, the resistance change ratio hardly was detected with the samples 1-1 to 1-4 having the ratio Z of 0.4 or lower. This is supposedly because the resistance values of the electro-resistance layers were small and it failed to apply a voltage of 3 V to the elements when applying the SET or RESET voltage. There is a possibility to gain a detectable resistance change ratio with the samples 1-1 to 1-4 by making the electro-resistance layers thicker.

It was difficult to pass a current through the element with only 3V of application voltage with the sample 1-10 having the electro-resistance layer made of AlN because, on the contrary, the resistance value of the electro-resistance layer was very large. At that, it was evaluated again by gradually increasing the application voltage. The element was broken down destructively and the resistance change ratio hardly was detected at this time.

Next, separately from the evaluation on the resistance change ratio above, the resistance change ratio of each sample, i.e. the samples 1-1 to 1-11 fabricated as above, after heat treatment (at 400° C. for 15 minutes) under a hydrogen atmosphere was evaluated. The evaluation method was the same as above. Results of the evaluation are shown in Table 2 below.

TABLE 2

| Sample No. | Weight Ratio Z in Electro-resistance Layer 3 | Resistance Change Ratio (fold) (After Heat Treatment) |
| --- | --- | --- |
| 1-1 | 0.1 | Less than 0.01 |
| 1-2 | 0.2 | Less than 0.01 |
| 1-3 | 0.3 | Less than 0.01 |
| 1-4 | 0.4 | Less than 0.01 |
| 1-5 | 0.5 | 10 |
| 1-6 | 0.6 | 210 |
| 1-7 | 0.7 | 600 |
| 1-8 | 0.8 | 550 |
| 1-9 | 0.9 | 45 |
| 1-10 | 1 (=AlN) | Less than 0.01 |
| 1-11 | 0 (=TiN) | Less than 0.01 |

*Weight Ratio $Z = X_2/(X_1 + X_2)$
$X_1$ denotes Ti content in the electro-resistance layer 3 (wt. %)
$X_2$ denotes Al content in the electro-resistance layer 3 (wt. %)

As shown in Table 2, the resistance change ratios as high as ten fold or more were obtained with the samples having their weight ratio Z in the range of 0.5 to 0.9, the same as those of the samples before the heat treatment. With the samples 1-6 and 1-7, the resistance change ratio was even increased by the heat treatment.

In addition, according to a similar evaluation by altering the junction area of each element, nearly the same results as above were obtained and it was found that the heat treatment stability of the electro-resistance element of the present invention is less prone to be affected by the junction area of the element.

Similar results were obtained when a Ti layer, an Al layer, a Cu layer, a Ta layer, an $Ir_{0.7}Ta_{0.3}$ layer, an ITO layer, an Ni layer, a Co layer, an Fe layer, a $Ti_{0.65}Al_{0.35}$ alloy layer and a $Ti_{0.65}Al_{0.35}N$ layer were employed as the lower electrode 2 instead of the TiN layer.

Example 2

In Example 2, a memory element 31 having the configuration shown in FIG. 4 was fabricated and its resistance change characteristics were evaluated. The evaluated sample was fabricated by the processes shown in FIGS. 10A to 10H above and its electro-resistance layer 3 was made of a TAN layer of the weight ratio Z=0.7.

A TEOS film with a thickness of 400 nm was employed as a protective insulation film 61. A stacked structure of a Ti film and a TiN film was employed as a barrier metal 63. A tungsten film was employed as a plug metal 64.

A TiN layer with a thickness of 200 nm was employed as a lower electrode 2, and it was formed in the same manner as Example 1.

A TAN layer of the weight ratio Z=0.7 with a thickness of 2 nm to 200 nm, typically 50 nm, was employed as an electro-resistance layer 3, and the TAN layer was formed by using an $Ti_{0.3}Al_{0.7}$ alloy as a target and by magnetron sputtering under a nitrogen-argon mixture atmosphere (nitrogen:argon (partial pressure ratio)=approximately 4:1) at a pressure of 0.1 Pa, setting a temperature of the Si substrate in the range between 250° C. and 400° C. (mainly at 350° C.) and the applied electric power at DC 5 kW A TiN layer typically with a thickness of 300 nm was employed as an upper electrode 4, and it was formed in the same manner as the lower electrode 2.

A TEOS film with a thickness of 800 nm was employed as a protective insulation film 66. A TaN film with a thickness of 10 nm was employed as an adhesive metal 68, and a Cu film with a thickness of 300 nm was employed as a wiring metal 69. The wiring metal 69 was deposited to configure bit lines 32 shown in FIG. 10H.

The memory element 31 (sample 2-1) having the configuration shown in FIG. 4 was fabricated in the above manner. The junction area of the sample 2-1 was 0.5 μm by 0.5 μm.

Pulsed voltages of SET, RESET and READ were applied as shown in FIG. 5 to the sample 2-1 fabricated in the above manner in order to confirm its operation as a memory element and to evaluate the resistance change ratio.

The operation was confirmed by measuring the current values output from the sample 2-1 on applying a voltage of 2 V (positive bias voltage) as the SET voltage, a voltage of −2 V (negative bias voltage, magnitude 2 V) as the RESET voltage, and a voltage of 0.05 V (positive bias voltage) as the READ voltage between a source 22 and the upper electrode 4 after turning ON a transistor 21 by applying a voltage to a gate 25. The pulse width of each voltage applied to the sample 2-1 was 200 ns. The current values were measured by detecting difference values from reference current values obtained by applying voltages having the same condition as the READ voltage applied to the sample 2-1 to a reference resistor disposed separately from the sample 2-1.

As the results of the operation confirmation, a 70 fold change in the resistance change ratio was obtained with the sample 2-1 and the capability of the sample to be operated stably as a memory element was confirmed. It was found that its resistance change characteristics, i.e. memory characteristics, were retained even upon applying the SET and RESET voltages at $10^7$ times or more.

Next, the resistance change ratio of a sample 2-1, fabricated separately from the sample used for evaluating the resistance change ratio above, after heat treatment (at 400° C. for 15 minutes) under a hydrogen atmosphere was evaluated similarly. A 65 fold change in the resistance change ratio was obtained with the sample 2-1 and the heat treatment stability of the sample under the hydrogen atmosphere was confirmed.

A sample employing a Cu layer as the lower electrode 2 instead of the TiN layer (sample 2-2) and a sample employing an Al layer as the lower electrode 2 (sample 2-3) were fabricated individually to evaluate the resistance change ratio after the heat treatment under the hydrogen atmosphere similarly to the sample 2-1. It was found that a six fold change in the resistance change ratio was obtained with the sample 2-2 and a four fold change with the sample 2-3. In both samples, it was found that their resistance change characteristics were retained even upon applying the SET and RESET voltages at $10^7$ times or more.

Then, a 16-bit memory array was constructed by aligning 16 of the samples 2-1 in a four by four matrix to confirm the operation of the memory array in the same manner as that of the sample 2-1 as a memory element, and its operation as a random access electro-resistance memory was confirmed.

Separately from fabricating the samples 2-1 to 2-3, comparative samples A1 to A8 having the configuration shown in Table 3 below were fabricated to evaluate the resistance change ratio of each comparative sample before and after heat treatment under a hydrogen atmosphere. The numbers in parentheses in the fields of the lower electrode, the electro-resistance layer and the upper electrode of the Table 3 indicate the thickness of each layer in nm. The properties, such as the configuration and the element junction area, of each layer except the lower electrode, the electro-resistance layer and the upper electrode in the comparative samples A1 to A8 were the same as those of the sample 2-1.

Each layer of the comparative samples A1 to A8 was formed in the following manner.

Pt layers as the lower and the upper electrodes of the samples A1 and A4 to A8 were formed by magnetron sputtering under an argon atmosphere at a pressure of 0.7 Pa, setting a temperature of the Si substrate at 27° C. and the applied electric power at 100 W.

A PCMO layer of the sample A1, and SrRuO$_3$ layers, BSTCO layers and SrZr$_{0.9980}$Cr$_{0.002}$O$_3$ (SZCO) layers of the samples A2 and A3 were formed by magnetron sputtering under an oxygen-argon mixture atmosphere (oxygen:argon (partial pressure ratio)=1:4) at a pressure of 3 Pa, setting a temperature of the Si substrate in the range between 400° C. and 750° C. (typically both at 400° C. and 750° C.) and the applied electric power at 100 W.

An Au layer of the sample A2 was formed by electron-beam evaporation, which deposits an Au target by sublimating with the electron beam, at room temperature as a temperature of the Si substrate.

A Ti/Pt layer of the sample A3 was formed in-situ in the order of Ti and Pt with a magnetron sputtering system having multi-cathode under an argon atmosphere at a pressure of 0.1 Pa, setting a temperature of the Si substrate at room temperature and the applied electric power at RF 100 W.

An NiO layer of the sample A4, an Nb$_2$O$_5$ layer of the sample A5, a TiO$_2$ layer of the sample A6, a WO$_3$ layer of the sample A7 and a CoO layer of the sample A8 were formed under an oxygen-argon mixture atmosphere (oxygen:argon (partial pressure ratio)=1:4) at a pressure of 3 Pa, setting a temperature of the Si substrate at 400° C. and the applied electric power at 100 W.

Results of evaluating the resistance change ratio before and after the heat treatment on the comparative samples A1 to A8 are shown in Table 3.

TABLE 3

| Sample No. (Comparative Example) | Lower Electrode | Electro-resistance Layer | Upper Electrode | Resistance Change Ratio (fold) (Before/After Heat Treatment) |
|---|---|---|---|---|
| A1 | Pt (120) | Pr$_{0.7}$Ca$_{0.3}$MnO$_3$ (750) | Pt (300) | 10/Less than 0.1 |
| A2 | SrRuO$_3$ (100) | Ba$_{0.5}$Sr$_{0.5}$Ti$_{0.998}$Cr$_{0.002}$O$_3$ (300) | Au (300) | 30/Less than 0.1 |
| A3 | SrRuO$_3$ (100) | SrZr$_{0.998}$Cr$_{0.002}$O$_3$ (300) | Ti/Pt (5/300) | 10/Less than 0.1 |
| A4 | Pt (100) | NiO (100) | Pt (300) | 800/1 |
| A5 | Pt (100) | Nb$_2$O$_5$ (100) | Pt (300) | Less than 0.1/Less than 0.1 |
| A6 | Pt (100) | TiO$_2$ (100) | Pt (300) | 10/0.5 |
| A7 | Pt (100) | WO$_3$ (100) | Pt (300) | 1/0.5 |
| A8 | Pt (100) | CoO (100) | Pt (300) | Less than 0.1/Less than 0.1 |

*Numbers in parentheses in the fields of the lower electrode, the electro-resistance layer and the upper electrode show the thickness of each layer in nm.

As shown in Table 3, some out of the comparative samples A1 to A8 could obtain a higher resistance change ratio, as high as ten fold or more, before the heat treatment under a hydrogen atmosphere, while every comparative sample showed the ratio decreased widely because of the heat treatment. According to U.S. Pat. No. 6,204,139 and JP 2002-537627A, several digits or more of the resistance change ratio was supposed to be obtained by an electro-resistance layer made of PCMO, BSTCO, SZCO or the like. With the samples A1 to A3 after the heat treatment, however, such a result was not replicated at all. This is considered to be because the electro-resistance layers of the samples A1 to A3 were deteriorated by the hydrogen exposure of the elements.

Similarly, according to JP 2004-363604A, several digits or more of the resistance change ratio was supposed to be obtained by an electro-resistance layer made of NiO, $Nb_2O_5$, $TiO_2$, $WO_3$ and CoO. With the samples A4 to A8 after the heat treatment, however, such a result was not replicated at all, either. This also is considered to be because the electro-resistance layers of the samples A4 to A8 were deteriorated by the hydrogen exposure of the elements.

Example 3

In Example 3, a memory element 31 having the configuration shown in FIG. 4 was fabricated and its resistance change characteristics were evaluated. The evaluated sample was fabricated by the processes shown in FIGS. 10A to 10H above and its electro-resistance layer 3 was made of Ti, Al, N and O (the weight ratio Z=0.7).

First, similarly to Example 2, a TAN layer of the weight ratio Z being 0.7 with a thickness of 2 nm to 200 nm, typically 50 nm, was formed, and then an electro-resistance layer 3 was formed by leaving the formed TAN layer under an oxygen-argon mixture atmosphere (oxygen:argon (partial pressure ratio)=1:4) at a pressure of 100 Pa at room temperature for one hour, i.e. by oxidizing it. Although the leakage current was prone to increase as the TAN layer was made thinner in the TAN layer before the oxidization, the leakage current was reduced remarkably by the oxidization. It is considered that the structure of the TAN layer was changed from the structure shown in FIG. 11A or 12A into that in FIG. 11B or 12B by the oxidization.

Each layer other than the layer 3 was formed in the similar manner as the sample 2-1, except for the thickness of TiN layer for the lower electrode 2 was made 100 nm and that for the upper electrode 4 was made 200 nm.

After forming each layer, the whole element was heat treated under a hydrogen atmosphere at 400° C. for 15 minutes to form a sample 3-1.

Voltages of SET, RESET and READ were applied to the sample 3-1 thus fabricated similarly to Example 2 in order to confirm its operation as a memory element and to evaluate its resistance change ratio.

As the results of the operation confirmation, an approximately 50 fold change in the resistance change ratio was obtained with the sample 3-1 and the capability of the sample to be operated stably as a memory element was confirmed. It was found that its resistance change characteristics, i.e. memory characteristics, were retained even upon applying the SET and RESET voltages at $10^7$ times or more.

Then, a 16-bit memory array was constructed by aligning 16 of the samples 3-1 in a four by four matrix to confirm the operation of the memory array in the same manner as that as a memory element, and its operation as a random access electro-resistance memory was confirmed.

Separately from fabricating the sample 3-1, an element (sample 3-2) having the electro-resistance layer 3, which is a layer formed by depositing an Al—N layer and a Ti—N layer both with a thickness of 1 nm or thinner alternately, was formed. The layer 3 of the sample 3-2 was formed by depositing a Ti—N film with a film thickness d of 0.4 nm as the first element nitride A, and an Al—N film with a film thickness D of 0.2 nm as the second element nitride B, alternately for a number of repeating n as 38 times, i.e. by forming a Ti—N film and an Al—N film 38 times alternately. Since each thickness of Ti—N film and Al—N film was as thin as 1 nm or less, the layer 3 thus formed is considered to have Ti and Al interdiffused. The film thickness d of the Ti—N film being 0.4 nm and the film thickness D of the Al—N film being 0.2 nm are equivalent to the weight ratio Z as the layer 3 being 0.7.

The Al—N film and the Ti—N film were deposited with a magnetron sputtering system that has multi-cathode using Ti and Al targets by enabling evaporation from each target through switching positions of a shutter and a wafer holder. Both films were deposited under the following conditions: under a nitrogen-argon atmosphere (nitrogen:argon (partial pressure ratio)=approximately 4:1) at a pressure of 0.1 Pa, setting a temperature of the Si substrate in the range of 250° C. to 400° C. (mainly at 350° C.) and the applied electric power at DC 5 kW. The thickness of the layer 3 formed by depositing the Al—N film and the Ti—N film in the manner described above was approximately 25 nm.

The other layers in the sample 3-2 were formed in the same manner as the sample 3-1.

Voltages of SET, RESET and READ were applied to the sample 3-2 thus fabricated similarly to Example 2 in order to confirm its operation as a memory element and to evaluate its resistance change ratio.

As the results of the operation confirmation, an approximately 100 fold change in the resistance change ratio was obtained with the sample 3-2 and the capability of the sample to be operated stably as a memory element was confirmed. There was no difference in the obtained resistance change ratio after the heat treatment at 400° C. for 15 minutes under a hydrogen atmosphere. It was found that its resistance change characteristics, i.e. memory characteristics, were retained even upon applying the SET and RESET voltages at $10^7$ times or more both before and after the heat treatment.

Separately from fabricating the sample 3-2, elements (samples 3-3 to 3-9) having the electro-resistance layer 3 formed in the following manner were formed: the layer 3 was formed by depositing a film made of the nitride A with a thickness of 1 nm or thinner and a film made of the nitride B with a thickness of 1 nm or thinner using Ta—N, Co—N, Cu—N, Nb—N and Ti—Ga—N other than Ti—N as the nitride A and Hf—N, Cr—N and Al—Si—N other than Al—N as the nitride B, in the same manner as the sample 3-2. The configuration of each element is shown in Table 4 below. In Table 4, d denotes thickness of the nitride A film in nm, D denotes that of the nitride B film in nm and n denotes number of times for repeating deposition.

TABLE 4

| Sample No. | Nitride A | Nitride B | d/D/n | Resistance Change Ratio (fold) (After Heat Treatment) |
|---|---|---|---|---|
| 3-2 | Ti—N | Al—N | 0.2/0.47/38 | 104 |
| 3-3 | Ta—N | Al—N | 0.2/0.47/38 | 93 |
| 3-4 | Co—N | Al—N | 0.3/0.7/25 | 58 |
| 3-5 | Cu—N | Al—N | 0.3/0.7/25 | 66 |
| 3-6 | Nb—N | Al—N | 0.2/0.47/38 | 84 |
| 3-7 | Ti—N | Hf—N | 0.7/0.8/17 | 92 |
| 3-8 | Ti—N | Cr—N | 0.4/0.6/25 | 65 |
| 3-9 | Ti—Ga—N | Al—Si—N | 0.2/0.47/38 | 45 |

*d denotes thickness of the Nitride A film (nm)
D denotes thickness of the Nitride B film (nm)
n denotes number of times for repeating deposition (times)

Voltages of SET, RESET and READ were applied to the samples 3-3 to 3-9 thus fabricated similarly to Example 2 in order to confirm the operation as a memory element and to evaluate their resistance change ratio.

As the results of the operation confirmation, a 45 fold or more change in the resistance change ratio was obtained with the samples 3-3 to 3-9 and the capability of the samples to be operated stably as a memory element was confirmed. There was no difference in the obtained resistance change ratio with the samples 3-3 to 3-9 after the heat treatment at 400° C. for 15 minutes under a hydrogen atmosphere, and it was found that its resistance change characteristics, i.e. memory characteristics, were retained even upon applying the SET and RESET voltages at $10^7$ times or more both before and after the heat treatment.

Example 4

In Example 4, a memory element 74 having the configuration shown in FIG. 14K was fabricated and its resistance change characteristics were evaluated. The evaluated sample was fabricated by the processes shown in FIGS. 14A to 14K above and its electro-resistance layer 3 was made of a TAN layer of the weight ratio Z=0.7.

A TEOS film with a thickness of 400 nm was employed as a protective insulation film 61a. A stacked structure of a Ti film and a TiN film was employed as a barrier metal 63. A tungsten film was employed as a plug metal 64.

A TiN layer with a thickness of 100 nm was employed as a lower electrode 2, and it was formed in the same manner as Example 1.

A TEOS film was employed as a protective insulation film 61b.

A TAN layer of the weight ratio Z=0.7 with a thickness of 2 nm to 200 nm, typically 50 nm, was employed as an electro-resistance layer 3, and the TAN layer was formed by using an $Ti_{0.3}Al_{0.7}$ alloy as a target and by magnetron sputtering under a nitrogen-argon mixture atmosphere (nitrogen:argon (partial pressure ratio)=approximately 4:1) at a pressure of 0.1 Pa, setting a temperature of the Si substrate in the range between 250° C. and 400° C. (mainly at 350° C.) and the applied electric power at DC 5 kW.

A TiN layer with a thickness of 200 nm was employed as an upper electrode 4, and it was formed in the same manner as the lower electrode 2.

A TEOS film with a thickness of 800 nm was employed as a protective insulation film 66. A TaN film with a thickness of 20 nm was employed as an adhesive metal 68, and a Cu film with a thickness of 300 nm was employed as a wiring metal 69. The wiring metal 69 was deposited to configure bit lines 32 shown in FIG. 14K.

As a final process, the whole element was heat treated at 400° C. for 15 minutes under a hydrogen atmosphere, and the memory element 74 (sample 4) having the configuration shown in FIG. 14K was fabricated.

Pulsed voltages of SET, RESET and READ were applied as shown in FIG. 5 to the sample 4 fabricated in the above manner in order to confirm its operation as a memory element and to evaluate its resistance change ratio.

The operation was confirmed by measuring the current values output from the sample 4 on applying a voltage of 2 V (positive bias voltage) as the SET voltage, a voltage of −2 V (negative bias voltage, magnitude 2 V) as the RESET voltage, and a voltage of 0.05 V (positive bias voltage) as the READ voltage between a source 22 and the upper electrode 4 after turning ON a transistor 21 by applying a voltage to a gate 25. The pulse width of each voltage applied to the sample 4 was 200 ns. The current values were measured by detecting difference values from reference current values obtained by applying voltages having the same condition as the READ voltage applied to the sample 4 to a reference resistor disposed separately from the sample 4.

As the results of the operation confirmation, an approximately 50 fold change in the resistance change ratio was obtained with the sample 4 and the capability of the sample to be operated stably as a memory element was confirmed. It was found that its resistance change characteristics were retained even upon applying the SET and RESET voltages at $10^7$ times or more, and thus it also was found that a memory element achieving an excellent endurance characteristics was formed. Results of the evaluation of the sample 4 are shown in Table 5 below.

TABLE 5

| Sample No. | Lower Electrode | Electro-resistance Layer | Upper Electrode | Resistance Change Ratio (fold) (After Heat Treatment) |
|---|---|---|---|---|
| 4 | TiN (120) | Ti—Al—N (750) | TiN (300) | 50 |

Next, the shapes (driving waveforms) of the voltages of SET, RESET and READ are changed from rectangular waveforms, as shown in FIG. 5, into trapezoidal waveforms with a slope of about 10 ns in each rising and falling edge of the pulse (without changing the pulse width), and the operation confirmation was performed. It was also confirmed to be capable of being operated stably as a memory element similar to the case in which their shapes were rectangular. The same was found for the case when the driving waveform was changed to a sine waveform (without changing the pulse width). It was found that the oscillating ringing noise, which used to arise at the rising and falling of the output signals of the element was reduced successfully on applying the pulsed voltage to the element by changing the driving waveform into the trapezoidal or the sine waveforms.

Next, a 16-bit memory array was constructed by aligning 16 of the samples 4 in a four by four matrix to confirm the operation of the memory array in the same manner as that of the sample 4 as a memory element, and its operation as a random access electro-resistance memory was confirmed.

As described above, the electro-resistance element according to the present invention is excellent in both affinity with semiconductor manufacturing processes and heat treatment stability under a hydrogen-containing atmosphere. Moreover, the electro-resistance element according to the present invention is capable of retaining information non-volatility as its electric resistance value and is micro-fabricated more easily than conventional charge storage type memory elements.

The electro-resistance element according to the present invention can be applied to various electronic devices, such as the next generation of high-density non-volatile memories. For example, it is expected to be applied to non-volatile memories, switching elements, sensors, and image display devices, which may be used for information communication terminals.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. An electro-resistance element comprising an electro-resistance layer, the electro-resistance layer having two or more states in which electric resistance values are different and being switchable from one of the two or more states into another by applying a voltage or current in one phase, and the electro-resistance layer comprising a nitride of a first element and a nitride of a second element, wherein the electro-resistance layer switches between the two or more states in one phase based on a Colossal Electro-Resistance effect.

2. The electro-resistance element according to claim 1, wherein the first and the second elements are a metallic element or Si.

3. The electro-resistance element according to claim 1, wherein the first element is at least one selected from Ti, Ta, Co, Cu and Nb.

4. The electro-resistance element according to claim 1, wherein the first element is Ti.

5. The electro-resistance element according to claim 1, wherein the second element is at least one selected from Al, Hf, Cr and Si.

6. The electro-resistance element according to claim 1, wherein the second element is Al.

7. The electro-resistance element according to claim 1, wherein the first element is Ti, the second element is Al, and a ratio Z of Al content $X_2$ (wt.%) in the electro-resistance layer to a sum of Ti content $X_1$ (wt.%) in the electro-resistance layer and the Al content $X_2$ ($Z=X_2/(X_1+X_2)$) is 0.5 to 0.9.

8. The electro-resistance element according to claim 1, wherein a volume resistivity of the first element in a state of nitride is $10^{-1}$ Ω·cm or lower, and a volume resistivity of the second element in a state of nitride is $10^3$ Ω·cm or greater.

9. The electro-resistance element according to claim 1, wherein the electro-resistance layer further includes oxynitride.

10. The electro-resistance element according to claim 9, wherein the electro-resistance layer includes an oxynitride of at least one element selected from the first and the second elements.

11. The electro-resistance element according to claim 10, wherein the oxynitride is at grain boundaries in the electro-resistance layer.

12. The electro-resistance element according to claim 10, wherein the electro-resistance layer has a granular structure in which domains are dispersed in a matrix, and at least a part of the domains is made of the oxynitride.

13. The electro-resistance element according to claim 9, wherein the oxygen content in the electro-resistance layer is 10 wt.% or lower.

14. The electro-resistance element according to claim 1, comprising a substrate and a multilayer structure disposed on the substrate, the multilayer structure including an upper electrode and a lower electrode, the electro-resistance layer being disposed between the upper and the lower electrodes.

15. The electro-resistance element according to claim 1, wherein the voltage or current is in a pulse form.

16. An electro-resistance memory comprising the electro-resistance element according to claim 1 as a memory element.

17. The electro-resistance memory according to claim 16, wherein two or more of the electro-resistance elements are aligned in a matrix.

18. The electro-resistance memory according to claim 17, wherein the two or more of electro-resistance elements is connected to a switching element for selecting the element when recording and reading information.

19. The electro-resistance element according to claim 1, wherein the resistivity of the nitride of the first element is lower than that of the nitride of the second element.

20. The electro-resistance element according to claim 1, wherein the electro-resistance layer is made of a solid solution of the nitride of the first element and the nitride of the second element.

21. The electro-resistance element according to claim 1, wherein the electro-resistance layer has a granular structure in which a domain of the nitride of the first element is dispersed in a matrix of the nitride of the second element.

22. The electro-resistance element according to claim 1, wherein the electro-resistance layer has a structure in which a film of the nitride of the first element and a film of the nitride of the second element are layered alternately.

23. The electro-resistance element according to claim 1, wherein the electro-resistance layer consists of the nitride of the first element and the nitride of the second element.

24. The electro-resistance element according to claim 23, wherein the first element is at least one selected from Ti, Ta, Co, Cu and Nb.

25. The electro-resistance element according to claim 23, wherein the second element is at least one selected from Al, Hf, Cr and Si.

* * * * *